United States Patent
Camm et al.

(10) Patent No.: US 7,445,382 B2
(45) Date of Patent: Nov. 4, 2008

(54) TEMPERATURE MEASUREMENT AND HEAT-TREATING METHODS AND SYSTEM

(75) Inventors: David M. Camm, Vancouver (CA); Shawna Kervin, Vancouver (CA); Marcel Edmond Lefrancois, Dartmouth (CA); Greg Stuart, Burnaby (CA)

(73) Assignee: Mattson Technology Canada, Inc., Vancouver, B.C. (CA)

( * ) Notice: Subject to any disclaimer, the term of this patent is extended or adjusted under 35 U.S.C. 154(b) by 133 days.

(21) Appl. No.: 10/497,447

(22) PCT Filed: Dec. 23, 2002

(86) PCT No.: PCT/CA02/01987

§ 371 (c)(1),
(2), (4) Date: Nov. 8, 2004

(87) PCT Pub. No.: WO03/060447

PCT Pub. Date: Jul. 24, 2003

(65) Prior Publication Data

US 2005/0063453 A1    Mar. 24, 2005

Related U.S. Application Data

(60) Provisional application No. 60/342,115, filed on Dec. 26, 2001.

(51) Int. Cl.
*G01J 5/00* (2006.01)
*G01K 13/00* (2006.01)

(52) U.S. Cl. .................................... 374/121; 374/141

(58) Field of Classification Search ................ 374/121, 374/141
See application file for complete search history.

(56) References Cited

U.S. PATENT DOCUMENTS 1,587,023 A    6/1926    Mottlau .................... 99/339

(Continued)

FOREIGN PATENT DOCUMENTS

CA    2339359    2/2000

(Continued)

OTHER PUBLICATIONS

International Search Report dated May 22, 2003.

(Continued)

*Primary Examiner*—Edward Lefkowitz
*Assistant Examiner*—Mirellys Jagan
(74) *Attorney, Agent, or Firm*—Knobbe, Martens, Olson & Bear, LLP

(57) ABSTRACT

Temperature measurement and heat-treating methods and systems. One method includes measuring a present intensity of radiation thermally emitted from a first surface of a workpiece, and identifying a present temperature of the first surface in response to the present intensity and at least one previous thermal property of the first surface. Preferably, the workpiece includes a semiconductor wafer, and the first and second surfaces respectively include device and substrate sides thereof. The present temperature of the device side is preferably identified while the device side is being irradiated, e.g. by an irradiance flash having a duration less than a thermal conduction time of the wafer. The device side temperature may be identified in response to a previous device side temperature, which may be identified in response to a previous temperature of the substrate side unequal to the previous device side temperature, and a temperature history of the wafer.

78 Claims, 11 Drawing Sheets

U.S. PATENT DOCUMENTS

| | | | |
|---|---|---|---|
| RE24,296 E | 3/1957 | Stewart | 219/410 |
| 2,981,819 A | 4/1961 | Gregory | 219/405 |
| 3,047,438 A | 7/1962 | Marinace | 117/91 |
| 3,108,173 A | 10/1963 | Barrett et al. | 99/389 |
| 3,160,517 A | 12/1964 | Jenkin | 427/585 |
| 3,213,827 A | 10/1965 | Jenkin | 118/725 |
| 3,227,065 A | 1/1966 | Litman | 99/241 |
| 3,239,651 A | 3/1966 | Silberman | 219/388 |
| 3,240,915 A | 3/1966 | Carter et al. | 392/411 |
| 3,460,510 A | 8/1969 | Currin | 118/720 |
| 3,502,516 A | 3/1970 | Henker | 117/103 |
| 3,623,712 A | 11/1971 | McNeilly et al. | 263/41 |
| 3,627,590 A | 12/1971 | Mammel | 148/1.5 |
| 3,661,637 A | 5/1972 | Sirtl | 117/201 |
| 3,692,572 A | 9/1972 | Strehlow | 359/586 |
| 3,700,850 A | 10/1972 | Lumley et al. | 219/121 LM |
| 3,836,751 A | 9/1974 | Anderson | 219/411 |
| 3,913,872 A | 10/1975 | Weber | 240/41 |
| 4,027,185 A | 5/1977 | Nodwell et al. | 313/35 |
| 4,041,278 A | 8/1977 | Boah | 219/411 |
| 4,081,313 A | 3/1978 | McNeilly et al. | 156/610 |
| 4,097,226 A | 6/1978 | Erikson et al. | 432/120 |
| 4,101,759 A | 7/1978 | Anthony et al. | 219/343 |
| 4,115,163 A | 9/1978 | Gorina et al. | 148/175 |
| 4,122,240 A | 10/1978 | Banas et al. | 428/655 |
| 4,151,008 A | 4/1979 | Kirkpatrick | 148/1.5 |
| 4,164,643 A | 8/1979 | Peart et al. | 219/411 |
| 4,220,483 A | 9/1980 | Cazcarra | 148/1.5 |
| 4,224,096 A | 9/1980 | Osborne | 156/380 |
| 4,233,493 A | 11/1980 | Nath | 219/354 |
| 4,306,731 A | 12/1981 | Shaw | 279/4 |
| 4,308,078 A | 12/1981 | Cook | 148/1.5 |
| 4,315,130 A | 2/1982 | Inagaki et al. | 219/121 L |
| 4,331,485 A | 5/1982 | Gat | 148/1.5 |
| 4,356,384 A | 10/1982 | Gat | 219/347 |
| 4,370,175 A | 1/1983 | Levatter | 148/1.5 |
| 4,375,993 A | 3/1983 | Mori et al. | 148/1.5 |
| 4,379,727 A | 4/1983 | Hansen et al. | 148/1.5 |
| 4,398,094 A | 8/1983 | Hiramoto | 250/492.1 |
| 4,421,048 A | 12/1983 | Adema et al. | 114/222 |
| 4,431,459 A | 2/1984 | Teng | 148/1.5 |
| 4,455,479 A | 6/1984 | Itoh et al. | 219/405 |
| 4,482,393 A | 11/1984 | Nishiyama et al. | 148/1.5 |
| 4,493,977 A | 1/1985 | Arai et al. | 219/411 |
| 4,504,323 A | 3/1985 | Arai et al. | 148/1.5 |
| 4,533,820 A | 8/1985 | Shimizu | 219/411 |
| 4,539,431 A | 9/1985 | Moddel et al. | 136/258 |
| 4,540,876 A | 9/1985 | McGinty | 219/405 |
| 4,550,245 A | 10/1985 | Arai et al. | 219/405 |
| 4,550,684 A | 11/1985 | Mahawili | 118/724 |
| 4,567,352 A | 1/1986 | Mimura et al. | 219/405 |
| 4,581,520 A | 4/1986 | Vu et al. | 219/349 |
| 4,636,969 A | 1/1987 | Kyoden et al. | 364/560 |
| 4,649,241 A | 3/1987 | Young et al. | 200/82 R |
| 4,649,261 A | 3/1987 | Sheets | 219/390 |
| 4,661,177 A | 4/1987 | Powell | 148/189 |
| 4,682,594 A | 7/1987 | Mok | 128/303.1 |
| 4,698,486 A | 10/1987 | Sheets | 250/492.2 |
| 4,700,102 A | 10/1987 | Camm et al. | 313/24 |
| 4,751,193 A | 6/1988 | Myrick | 437/19 |
| 4,755,654 A | 7/1988 | Crowley et al. | 219/405 |
| 4,787,551 A | 11/1988 | Hoyt et al. | 228/179 |
| 4,794,619 A | 12/1988 | Tregay | 374/131 |
| 4,818,327 A | 4/1989 | Davis et al. | 156/345 |
| 4,826,269 A | 5/1989 | Streifer et al. | 350/3.72 |
| 4,851,358 A | 7/1989 | Huber | 437/10 |
| 4,857,689 A | 8/1989 | Lee | 219/10.71 |
| 4,857,704 A | 8/1989 | Jannot et al. | 219/354 |
| 4,890,245 A * | 12/1989 | Yomoto et al. | 702/135 |
| 4,891,499 A | 1/1990 | Moslehi | 219/502 |
| 4,933,887 A | 6/1990 | Danko et al. | 364/557 |
| 4,937,490 A | 6/1990 | Camm et al. | 313/12 |
| 4,956,538 A | 9/1990 | Moslehi | 219/121.6 |
| 4,958,061 A | 9/1990 | Wakabayashi et al. | 219/411 |
| 4,959,244 A | 9/1990 | Penney et al. | 427/53.1 |
| 4,979,134 A | 12/1990 | Arima et al. | |
| 4,981,815 A | 1/1991 | Kakoschke | 437/173 |
| 4,984,902 A | 1/1991 | Crowley et al. | 374/1 |
| 5,002,630 A | 3/1991 | Kermani et al. | 156/610 |
| 5,011,794 A | 4/1991 | Grim et al. | 437/247 |
| 5,041,714 A | 8/1991 | Funk | 219/121.62 |
| 5,073,698 A | 12/1991 | Stultz | 219/405 |
| 5,155,336 A | 10/1992 | Gronet et al. | 219/411 |
| 5,155,337 A | 10/1992 | Sorrell et al. | 219/411 |
| 5,188,458 A | 2/1993 | Thompson et al. | 374/121 |
| 5,196,353 A | 3/1993 | Sandhu et al. | 437/8 |
| 5,213,985 A * | 5/1993 | Sandroff et al. | 438/7 |
| 5,219,786 A | 6/1993 | Noguchi | 437/174 |
| 5,231,595 A | 7/1993 | Makino et al. | 364/557 |
| 5,249,142 A * | 9/1993 | Shirakawa et al. | 702/135 |
| 5,255,286 A | 10/1993 | Moslehi et al. | 374/121 |
| 5,258,824 A | 11/1993 | Carlson et al. | 356/382 |
| 5,271,084 A | 12/1993 | Vandenabeele et al. | 392/416 |
| 5,275,629 A | 1/1994 | Ajika et al. | 29/25.01 |
| 5,279,973 A | 1/1994 | Suizu | 437/25 |
| 5,282,017 A | 1/1994 | Kasindorf et al. | 356/446 |
| 5,293,216 A | 3/1994 | Moslehi | 356/371 |
| 5,305,417 A | 4/1994 | Najm et al. | 392/418 |
| 5,308,161 A | 5/1994 | Stein | |
| 5,310,260 A | 5/1994 | Schietinger et al. | 374/142 |
| 5,313,044 A | 5/1994 | Massoud et al. | 219/121.85 |
| 5,317,429 A | 5/1994 | Mochizuki et al. | 359/42 |
| 5,317,656 A | 5/1994 | Moslehi et al. | 385/12 |
| 5,325,180 A | 6/1994 | Chappelow et al. | 356/401 |
| 5,326,173 A | 7/1994 | Evans et al. | 374/128 |
| 5,336,641 A | 8/1994 | Fair et al. | 437/248 |
| 5,347,128 A | 9/1994 | Puram et al. | 250/330 |
| 5,350,899 A | 9/1994 | Ishikawa et al. | 219/494 |
| 5,359,693 A | 10/1994 | Nenyei et al. | 392/418 |
| 5,364,186 A | 11/1994 | Wang et al. | 374/126 |
| 5,373,135 A | 12/1994 | Beyer et al. | 219/121.67 |
| 5,387,557 A | 2/1995 | Takagi | 437/247 |
| 5,399,506 A | 3/1995 | Tsukamoto | 437/19 |
| 5,399,523 A | 3/1995 | Kakoschke | 437/173 |
| 5,407,485 A | 4/1995 | Takagi | 118/724 |
| 5,418,885 A | 5/1995 | Hauser et al. | 392/416 |
| 5,431,700 A | 7/1995 | Sloan | 29/25.01 |
| 5,436,172 A | 7/1995 | Moslehi | 437/8 |
| 5,436,443 A | 7/1995 | Abtahi | 250/225 |
| 5,442,727 A | 8/1995 | Fiory | 392/416 |
| 5,444,217 A | 8/1995 | Moore et al. | 219/405 |
| 5,445,676 A | 8/1995 | Takagi | 118/719 |
| 5,446,824 A | 8/1995 | Moslehi | 392/416 |
| 5,446,825 A | 8/1995 | Moslehi et al. | 392/416 |
| 5,460,451 A | 10/1995 | Wadman | 374/126 |
| 5,463,534 A | 10/1995 | Raven | 362/32 |
| 5,487,127 A | 1/1996 | Gronet et al. | 392/416 |
| 5,490,728 A | 2/1996 | Schietinger et al. | 374/7 |
| 5,501,637 A | 3/1996 | Duncan et al. | 374/126 |
| 5,508,934 A | 4/1996 | Moslehi et al. | 364/468 |
| 5,514,885 A | 5/1996 | Myrick | 257/216 |
| 5,517,359 A | 5/1996 | Gelbart | 359/623 |
| 5,530,221 A | 6/1996 | Benda et al. | 219/121.83 |
| 5,539,855 A | 7/1996 | Takahashi et al. | 392/416 |
| 5,553,939 A * | 9/1996 | Dilhac et al. | 374/1 |
| 5,561,612 A | 10/1996 | Thakur | 364/557 |
| 5,561,735 A | 10/1996 | Camm | 392/416 |
| 5,568,978 A * | 10/1996 | Johnson et al. | 374/161 |
| 5,580,388 A | 12/1996 | Moore | 118/728 |
| 5,593,608 A | 1/1997 | Suzuki | 219/492 |
| 5,597,237 A | 1/1997 | Stein | 374/9 |
| 5,601,366 A | 2/1997 | Paranjpe | 374/126 |
| 5,603,772 A | 2/1997 | Ide | 118/724 |
| 5,604,592 A | 2/1997 | Kotidis et al. | 356/357 |

| | | | |
|---|---|---|---|
| 5,628,564 A | 5/1997 | Nenyei et al. | 374/121 |
| 5,635,093 A | 6/1997 | Arena et al. | 219/466 |
| 5,635,409 A | 6/1997 | Moslehi | 438/7 |
| 5,650,082 A | 7/1997 | Anderson | 219/390 |
| 5,654,904 A | 8/1997 | Thakur | 364/557 |
| 5,667,300 A * | 9/1997 | Mandelis et al. | 374/43 |
| 5,677,240 A | 10/1997 | Murakami et al. | 437/195 |
| 5,683,180 A * | 11/1997 | De Lyon et al. | 374/161 |
| 5,710,407 A | 1/1998 | Moore et al. | 219/405 |
| 5,715,361 A | 2/1998 | Moslehi | 392/416 |
| 5,727,017 A * | 3/1998 | Maurer et al. | 374/9 |
| 5,738,440 A | 4/1998 | O'Neill et al. | 374/9 |
| 5,790,750 A | 8/1998 | Anderson | 392/416 |
| 5,802,099 A | 9/1998 | Curran et al. | 374/131 |
| 5,809,211 A | 9/1998 | Anderson et al. | 392/416 |
| 5,814,365 A | 9/1998 | Mahawili | 427/10 |
| 5,815,396 A | 9/1998 | Shimamura et al. | |
| 5,822,172 A | 10/1998 | White | 361/234 |
| 5,830,277 A | 11/1998 | Johnsgard et al. | 118/725 |
| 5,841,110 A | 11/1998 | Nenyei et al. | 219/497 |
| RE36,050 E | 1/1999 | Thakur et al. | 374/161 |
| 5,858,819 A | 1/1999 | Miyasaka | 438/149 |
| 5,893,952 A | 4/1999 | Aronowitz et al. | 118/725 |
| 5,900,649 A | 5/1999 | Effelsberg | 257/81 |
| 5,908,307 A | 6/1999 | Talwar et al. | 438/199 |
| 5,937,142 A | 8/1999 | Messner et al. | |
| 5,944,422 A | 8/1999 | Doitel et al. | 374/131 |
| 5,960,158 A | 9/1999 | Gat et al. | 392/416 |
| 5,971,565 A | 10/1999 | Zapata et al. | 362/294 |
| 5,993,059 A | 11/1999 | O'Neill et al. | 374/126 |
| 5,998,768 A | 12/1999 | Hunter et al. | 219/502 |
| 6,016,383 A | 1/2000 | Gronet et al. | 392/416 |
| 6,051,483 A | 4/2000 | Lee et al. | 438/530 |
| 6,066,516 A | 5/2000 | Miyasaka | 438/149 |
| 6,108,490 A | 8/2000 | Lee et al. | 392/416 |
| 6,122,439 A | 9/2000 | Gronet et al. | 392/416 |
| 6,168,310 B1 * | 1/2001 | Kurosaki et al. | 374/161 |
| 6,171,641 B1 | 1/2001 | Kobayashi et al. | |
| 6,183,130 B1 * | 2/2001 | Adams et al. | 374/131 |
| 6,187,616 B1 | 2/2001 | Gyoda | 438/160 |
| 6,217,212 B1 * | 4/2001 | Brenninger et al. | 374/45 |
| 6,283,630 B1 | 9/2001 | Yazawa | 374/128 |
| 6,293,696 B1 | 9/2001 | Guardado | 374/2 |
| 6,303,411 B1 | 10/2001 | Camm et al. | 438/149 |
| 6,303,917 B1 | 10/2001 | Hawryluk | 250/205 |
| 6,315,878 B1 | 11/2001 | Patadia et al. | 204/298.15 |
| 6,348,099 B1 | 2/2002 | Xia et al. | 118/697 |
| 6,349,270 B1 | 2/2002 | Gurary et al. | 702/134 |
| 6,375,348 B1 | 4/2002 | Hebb et al. | 374/9 |
| 6,376,806 B2 | 4/2002 | Yoo | 219/411 |
| 6,494,371 B1 | 12/2002 | Rekow et al. | 235/454 |
| 6,531,681 B1 | 3/2003 | Markle et al. | 219/121.8 |
| 6,534,752 B2 * | 3/2003 | Camm et al. | 219/497 |
| 6,536,131 B2 | 3/2003 | Davis | 34/58 |
| 6,594,446 B2 | 7/2003 | Camm et al. | 392/416 |
| 6,608,967 B1 | 8/2003 | Arrison | 392/407 |
| 6,609,909 B2 | 8/2003 | Aoki et al. | 432/258 |
| 6,613,685 B1 | 9/2003 | Granneman et al. | 438/710 |
| 6,621,199 B1 | 9/2003 | Parfeniuk et al. | 313/231.51 |
| 6,634,882 B2 | 10/2003 | Goodman | 432/253 |
| 6,645,356 B1 | 11/2003 | Woodruff et al. | 204/242 |
| 6,669,783 B2 | 12/2003 | Sexton et al. | 118/728 |
| 6,702,302 B2 | 3/2004 | Smedt et al. | 279/106 |
| 6,752,625 B1 | 6/2004 | Aschner et al. | 432/253 |
| 6,798,142 B2 | 9/2004 | Eguchi | 315/115 |
| 6,849,831 B2 | 2/2005 | Timans et al. | 219/390 |
| 6,855,916 B1 | 2/2005 | Matthews et al. | 219/390 |
| 6,859,616 B2 | 2/2005 | Kusuda et al. | 392/416 |
| 6,885,815 B2 | 4/2005 | Kusuda et al. | 392/416 |
| 6,897,130 B2 | 5/2005 | Miyauchi et al. | 438/502 |
| 6,938,649 B2 | 9/2005 | Nakazawa | 141/7 |
| 6,941,063 B2 | 9/2005 | Camm et al. | 392/416 |
| 6,953,338 B2 | 10/2005 | Kreiser et al. | 432/259 |
| 6,963,692 B2 | 11/2005 | Camm et al. | 392/416 |
| 6,987,240 B2 | 1/2006 | Jennings et al. | 219/121.8 |
| 6,998,580 B2 | 2/2006 | Kusuda et al. | 219/411 |
| 7,002,363 B2 | 2/2006 | Mathieu | 324/758 |
| 7,005,601 B2 | 2/2006 | Jennings | 219/121.66 |
| 2001/0047990 A1 | 12/2001 | Yoo | |
| 2002/0066859 A1 * | 6/2002 | Ino et al. | 250/339.04 |
| 2002/0080850 A1 * | 6/2002 | Baba | 374/43 |
| 2003/0081945 A1 | 5/2003 | Kusuda | 392/416 |
| 2003/0196993 A1 | 10/2003 | Jennings | 219/121.8 |
| 2004/0105670 A1 | 6/2004 | Kusuda et al. | 392/418 |
| 2004/0178553 A1 | 9/2004 | Camm et al. | 269/55 |
| 2005/0018196 A1 | 1/2005 | Kusuda | 356/448 |
| 2005/0062388 A1 | 3/2005 | Camm et al. | 313/231.71 |
| 2005/0063448 A1 | 3/2005 | Kusuda | 374/1 |
| 2005/0133167 A1 | 6/2005 | Camm et al. | 156/345.51 |
| 2005/0179354 A1 | 8/2005 | Camm et al. | 313/231.51 |
| 2006/0096677 A1 | 5/2006 | Camm et al. | 392/416 |
| 2007/0069161 A1 | 3/2007 | Camm et al. | 250/504 |

FOREIGN PATENT DOCUMENTS

| | | |
|---|---|---|
| DE | 42 23 133 | 1/1993 |
| EP | 0 399 662 A2 | 11/1990 |
| EP | 0 538 874 A1 | 4/1993 |
| EP | 0 576 791 A1 | 1/1994 |
| EP | 0 598 409 A1 | 5/1994 |
| EP | 0 840 360 A2 | 5/1998 |
| EP | 0 942 268 | 9/1999 |
| EP | 1 073 096 A1 | 1/2001 |
| GB | 938699 | 10/1963 |
| GB | 2 065 973 A | 7/1981 |
| JP | 55-115327 | 9/1980 |
| JP | 56-048128 | 5/1981 |
| JP | 57-080729 | 5/1982 |
| JP | 57-208146 | 12/1982 |
| JP | 58-070536 | 4/1983 |
| JP | 58-106836 | 6/1983 |
| JP | 59-211221 | 11/1984 |
| JP | 01-246828 | 10/1989 |
| JP | 01-268120 | 10/1989 |
| JP | 02-294027 | 12/1990 |
| JP | 04-355911 | 12/1992 |
| JP | 5-295543 | 11/1993 |
| JP | 06-318558 | 11/1994 |
| JP | 07-245274 | 9/1995 |
| JP | 08-107113 | 4/1996 |
| JP | 08 261967 | 10/1996 |
| JP | 10-110977 | 4/1998 |
| JP | 11-097371 | 4/1999 |
| NO | 32864 | 8/1921 |
| WO | WO 87/05054 | 8/1987 |
| WO | WO 91/10873 | 7/1991 |
| WO | WO 94/01982 | 1/1994 |
| WO | WO 99/41777 | 8/1999 |
| WO | WO 99/58733 | 11/1999 |
| WO | WO 99/60184 | 11/1999 |
| WO | WO 00/67298 | 11/2000 |
| WO | WO 01/56064 | 8/2001 |
| WO | WO 02/47123 | 6/2002 |
| WO | WO 02/47143 | 6/2002 |
| WO | WO 03/060447 | 7/2003 |
| WO | WO 2004/057650 | 7/2004 |
| WO | WO 2005/029014 | 3/2005 |
| WO | WO 2005/059991 | 6/2005 |
| WO | WO 2005/078762 | 8/2005 |

OTHER PUBLICATIONS

Blake, J., et al., "Slip Free Rapid Thermal Processing", Mat. Res. Soc. Symp. Proc., vol. 92, p. 265-272 (1987).

Bomke, H. A., et al., "Annealing of Ion-Implanted Silicon by an Incoherent Light Pulse," Appl. Phys. Lett., vol. 33, No. 11, pp. 955-957, Dec. 1, 1978.

Burggraaf, P. S., "Rapid Wafer Heating: Status 1983," Semiconductor International, pp. 69-74, Dec. 1983.

Camm, D. M., et al. "2D Real Time Temperature Measurements in a New Short Wavelength Arc Lamp RTP Chamber for Improved Uniformity", Proc. 3rd Int. RTP Conf., RTP'95 p. 241 (Round Rock Texas) (1995).

Camm, D. M, et al., "Engineering Ultra-Shallow Junctions Using fRTP™", 10th IEEE International Conference on Advanced Thermal Processing of Semiconductors—RTP 2002, pp. 5-10 (2002).

Camm, D. M., et al., "High Power Arc Lamp RTP System for High Temperature Annealing Applications", Proc. 2nd Int. RTP Conf., RTP'94 (1994), p. 259 (Round Rock Texas).

Camm, D. M., et al., "Spike Thermal Processing Using Arc Lamps," Advances in Rapid Thermal Processing, (2000).

Celler, G. K., et al., "Drift of Arsenic in SiO2 in a Lamp Furnace with a Built-in Temperature Gradient", Mat. Res. Soc. Symp. Proc., vol. 92, p. 53-58 (1987).

Chen, M. M., et al., "The Use of a Kaleidoscope to Obtain Uniform Flux Over a Large Area in a Solar or Arc Imaging Furnace," Applied Optics, vol. 2, No. 3, pp. 265-271, Mar. 1963.

Cibere, J. J, et al., "Flash Thermal Processing Through the Melting Point of Silicon", 11th IEEE International Conference on Advanced Thermal processing of Semiconductors—RTP 2003 (2003).

Cohen, R. L., et al., "Thermally Assisted Flash Annealing of Silicon and Germanium", Appl. Phys. Lett. vol. 33, No. 8, pp. 751-753, Oct. 1978.

Current, M., et al., "Ion Implantation and Rapid Annealing of 125 mm Wafers," Solid State Technology, pp. 197-202, Oct. 1983.

Dilhac, J-M., et al., "Adaptive Process Control for a Rapid Thermal Processor", SPIE vol. 1393, Rapid Thermal and Related Processing Techniques, p. 395-403 (1990).

Dilhac, J-M., et al, "Thermal Model for Rapid Thermal Processors: Theory and Applications", RTP '93 Conference Proceedings, pp. 12-18 (1993).

Fair, R. B., "Rapid Thermal Processing—A Justification", in Fair, R. B., ed., *Rapid Thermal Processing: Science and Technology* (Boston: Academic Press, Inc., 1993), pp. 1-11.

Fan, J. C. C., et al., "Transient Heating with Graphite Heaters for Semiconductor Processing," in Appleton, B. R. et al., ed., *Laser and Electron-Beam Interactions with Solids: Proceedings of the Materials Research Society Annual Meeting*, Nov. 1981, Boston (New York: North Holland / Elsevier, 1982), pp. 751-758.

Fiory, A. T., et al., "Annealing Ultra-Low Energy Boron Implants with an Arc Lamp System," RTP 1999, pp. 273-280 (1999).

Fiory, A. T., et al., "Electrical Measurements of Annealed Boron Implants for Shallow Junctions," Advances in Rapid Thermal Processing, vol. 99-10, pp. 133-140, (1999).

Fiory, A. T., et al., "Spike Annealing of Implanted PMOS Gates," Proc. of RTP 2000 Conference, pp. 1-8, Sep. 20-22, 2000.

Gat, A., et al. "Introduction to Heatpulse™ Processing Technology," AG Associates. Mountain View, California, pp. 1-29.

Gelpey, J. C., et al., "Advanced Annealing for Sub-130nm Junction Formation", 201st Electrochemical Society Meeting, Symposium Q1, Rapid Thermal and Other Short-Time Processing Technologies III, May 12-17, 2002, paper 735 (May 2002).

Gelpey, J. C., et al., "Process Control for a Rapid Optical Annealing System," Mat. Res. Soc. Symp. Press, vol. 52 (1986).

Gelpey, J. C., et al., "Rapid Optical Annealing Using the Water-Wall DC Arc Lamp," Microelectronic Manufacturing and Testing, pp. 22-24, Aug. 1983.

Hill, C., et al., "Rapid Thermal Annealing—Theory and Practice", in Levy, R. A., ed., *Reduced Thermal Processing for ULSI* (New York: Plenum, 1989), pp. 143-180.

Hirscher, H., "Electrostatic Chuck to Boost your Yield", Unaxis Wafer Processing, Chip Online, Issue No. 5, pp. 39-43, undated.

Kakoschke, R., "Is There a Way to a Perfect Rapid Thermal Processing System?", Mat. Res. Soc. Symp. Proc., vol. 224, p. 159-170 (1991).

Kakoschke, R., et al., "Simulation of Temperature Effects During Rapid Thermal Processing", Mat. Res. Soc. Symp. Proc., vol. 146, p. 473-482 (1989).

Kapany, N. S., et al., "Fiber Optics. Part II. Image Transfer on Static and Dynamic Scanning with Fiber Bundles," Journal of the Optical Society of America, vol. 47, No. 5, pp. 423-427, May 1957.

Klabes, R., et al., "Pulsed Incoherent Light Annealing of Arsenic and Phosphorus Implanted Polycrystalline Silicon," Physica Status Solidi, pp. K5-K7, K9-K12 (1982).

Lefrancois, M. E., et al., "Emissivity Independent Process Control in a Short Wavelength Arc Lamp RTP Chamber", in *MRS Symposium Proceedings*, vol. 429, Rapid Thermal and Integrated Processing V (Pittsburgh, 1996), p. 321.

Lefrancois, M., et al., "Temperature Uniformity During Impulse™ Anneal," 8th International Conference on Advanced Thermal Processing of Semiconductors, RTP 2000, pp. 1-6, Sep. 20-22, 2000.

Lietoila, A., et al., "Temperature Rise Induced in Si by Continuous Xenon Arc Lamp Radiation," American Institute of Physics, vol. 53, No. 2, pp. 1169-1172, Feb. 1982.

Lischner, D. J., et al., "Rapid Large Area Annealing of Ion-Implanted Si with Incoherent Light," in Appleton, B. R. et al., ed., *Laser and Electron-Beam Interactions with Solids: Proceedings of the Materials Research Society Annual Meeting*, Nov. 1981, Boston (New York: North Holland / Elsevier, 1982), pp. 759-764.

Lojek, B., "Issues in Manufacturing Unique Silicon Devices Using Rapid Thermal Annealing", in Fair, R. B., ed., *Rapid Thermal Processing: Science and Technology* (Boston: Academic Press, Inc., 1993), pp. 311-347.

Lord, H. A., "Thermal and Stress Analysis of Semiconductor Wafers in a Rapid Thermal Processing Oven", IEEE Transactions on Semiconductor Manufacturing, vol. 1, No. 3, p. 105-114 (Aug. 1988).

Lue, J. T., "Arc Annealing of BF+2 Implanted Silicon by a Short Pulse Flash Lamp," Appl. Phys. Lett., vol. 36, No. 1, pp. 73-76, Jan. 1, 1980.

Myer, J. H., "Zoomable Kaleidoscopic Mirror Tunnel," Applied Optics, vol. 10, No. 9, pp. 2179-2182, Sep. 1971.

Nishiyama, K., et al., "Radiation Annealing of Boron-Implanted Silicon with a Halogen Lamp," Japanese Journal of Applied Physics, vol. 19, No. 10, pp. L563-L566, Oct. 1980.

Nulman, J., et al., "Pyrometric Emissivity Measurements and Compensation in an RTP Chamber", Mat. Res. Soc. Symp. Proc., vol. 146, p. 461-466 (1989).

Potter, R. J., "Transmission Properties of Optical Fibers," Journal of the Optical Society of America, vol. 51, No. 10, pp. 1079-1089, Oct. 1961.

Powell, R. A., et al., "Activation of Arsenic-Implanted Silicon Using an Incoherent Light Source," Appl. Phys. Lett., vol. 39, No. 2, pp. 150-152, Jul. 15, 1981.

Powell, R. A., et al., "Annealing of Implantation Damage in Integrated-Circuit Devices Using an Incoherent Light Source," J. Vac. Sci. Technol., vol. 20, No. 1, pp. 32-36, Jan. 1982.

Riccardi, A., et al., "The Adaptive Secondary Mirror for the 6.5m Conversion of the Multiple Mirror Telescope", Beyond Conventional Adaptive Optics, Venice, 2001.

Roozeboom, F., "Manufacturing Equipment Issues in Rapid Thermal Processing", in Fair, R. B., ed., *Rapid Thermal Processing: Science and Technology* (Boston: Academic Press, Inc., 1993), pp. 349-423.

Ross, J., et al., "Characterizing Implant Behavior During Flash RTP by Means of Backside Diagnostics", 10th IEEE International Conference on Advanced Thermal Processing of Semiconductors—RTP 2002, pp. 99-105 (2002).

Sedgwick, T.O., "Short Time Annealing," J. Electrochem. Soc., vol. 130, No. 2, pp. 484-492, Feb. 1983.

Semco Engineering, "Smart Solutions for . . . Single Wafer Clamping", as available from http://www.semcoeng.com/Pilot01/Rubrique/Index.php3?IdTheme=6&IdPage=24 on Jul. 11, 2006 (undated).

Semiconductor Industry Association, "International Technology Roadmap for Semiconductors," International Sematech. Austin Texas, pp. 7, 14, 123-131, (1999).

Service Support Specialties, "Hot Plates". as available from http://www.s-cubed.com/pdf/StandAloneHP.pdf on Jul. 11, 2006.

Sheets, R. E., "Automatic Cassette to Cassette Radiant Impulse Processor," Nuclear Instruments and Methods in Physics Research, Amsterdam, North Holland / Elsevier Science Publishers B. V., pp. 219-223 (1985).

Stuart, G. C., et al., "Temperature Diagnostics for a Dual-Arc FRTP Tool", 10th IEEE International Conference on Advanced Thermal Processing of Semiconductors—RTP 2002—pp. 77-82 (2002).

Sumitomo Osaka Cement Co., Ltd., Advanced Materials Research Division, "Characteristics of fine Al2-O3-SiC Composite ESC", Technical Report, 1999.

Tamarack Scientific Company, "Transient Calorimeter Calibration System," Technical Report AFFDL-TR-75-24, Orange, California, pp. 1-50, Mar. 1975.

Tichy, R. S., et al., "Annealing of Ultra-Shallow Implanted Junctions Using Arc-Lamp Technology: Achieving the 90 nm Node", 9th IEEE International Conference on Advanced Thermal Processing of Semiconductors—RTP 2001 (Sep. 2001).

Tillmann, A., et al., "Processing of 200 and 300 mm Wafers in an Advanced Rapid Thermal Processing System", Proc. RTP 1998, 6th International Conference on Advanced Thermal Processing of Semiconductors, Kyoto, Japan, 1998, pp. 62-63 (1998).

Vandenabeele, P., et al., "Impact of Patterned Layers on Temperature Non-Uniformity During Rapid Thermal Processing for VLSI-Applications", Mat. Res. Soc. Symp. Proc., vol. 146, p. 149-160 (1989).

Varian, Extrion Division Semiconductor Equipment Group, "RTP-800 Rapid Thermal Processor," pp. 1-6, Dec. 1985.

von Gutfeld, R. J., "Crystallization of Silicon for Solar Cell Applications," IBM Technical Disclosure, vol. 19, IBM Corp., pp. 3955-3956, Mar. 1977.

Williamson, D. E., "Cone Channel Condenser Optics," Journal of the Optical Society of America, vol. 42, No. 10, pp. 712-715, Oct. 1952.

Wilson, S. R. et al., "An Overview and Comparison of Rapid Thermal Processing Equipment: A User's Viewpoint", Mat. Res. Soc. Symp. Proc., vol. 52, p. 181-190 (1986).

Office Action dated Aug. 12, 2008, issued to a related pending U.S. Appl. No. 11/302,600.

* cited by examiner

TEMPERATURE MEASUREMENT AND HEAT-TREATING METHODS AND SYSTEM

CROSS-REFERENCE TO RELATED APPLICATIONS

This application claims the benefit of priority from U.S. patent application Ser. No. 60/342,115 filed Dec. 26, 2001, which is incorporated herein by reference.

FIELD OF THE INVENTION

Aspects of the present invention relate to methods and systems for temperature measurement. Further aspects of the invention relate to methods and systems for heat-treating a workpiece.

BACKGROUND OF THE INVENTION

In some applications, it is necessary to determine the temperature of a workpiece whose temperature is difficult to directly measure. For example, where the workpiece is a semiconductor wafer, although the temperature of a substrate side of the wafer may often be measured directly, it is not possible to accurately directly measure the temperature of the device side of the wafer, as the non-uniform patterning of devices on the device side gives rise to significant variations in both scattering and emissivity from location to location across the device side, resulting in significant temperature measurement errors.

In the past, this did not pose a significant problem, as many rapid thermal processing cycles involved heating the substrate side of the wafer at heating or ramp rates that were slow compared to a thermal conduction time through the wafer (typically 10-15 milliseconds), so that the temperature of a given location on the device side could be presumed to equal the temperature of the corresponding opposing location on the substrate side, and the errors resulting from such a presumption were not critical for the purpose of achieving performance requirements applicable at that time (which are now quickly becoming obsolete).

However, these conventional techniques cannot produce sufficiently shallow junctions to comply with current and upcoming industry requirements. A new technique to address this difficulty is disclosed in pending Patent Cooperation Treaty application publication numbers WO 02/47143 and WO 02/47123 (which are incorporated herein by reference), and involves pre-heating the entire wafer to an intermediate temperature by irradiating the substrate side at a ramp rate slower than the thermal conduction rate through the wafer, then heating the device side of the wafer at a rate much faster than the thermal conduction rate, by irradiating the device side. As an arbitrary example, the wafer may be pre-heated to an intermediate temperature such as 800° C. for example, by irradiating the substrate side with an arc lamp to heat the entire wafer at a rate such as 400° C./second, for example. The device side may then be exposed to a high-intensity flash from a flash lamp, such as a one-millisecond flash, to heat only the device side to an annealing temperature such as 1300° C., for example. Due to the rapid heating rate of the device side during the flash (on the order of $10^{5}$° C./s), the bulk of the wafer remains at the intermediate temperature, and acts as a heat sink to then cool the device side following the flash.

To minimize performance variations from wafer to wafer, it is important to ensure that each wafer is subjected to a consistently reproducible thermal process, as close as possible to an identical process from wafer to wafer. For this purpose, it would be desirable to accurately measure the temperature of the device side of the wafer during the flash, and to use such temperature measurements for feedback-control of the intensity of the flash. However, as noted, conventional methods are not adequate to accurately measure the temperature of the device side for this purpose.

Accordingly, there is a need for an improved way of measuring the temperature of a workpiece, and for an improved way of heat-treating the workpiece.

SUMMARY OF THE INVENTION

The present invention addresses the above need by providing, in accordance with a first aspect of the invention, a temperature measurement method. The method includes measuring a present intensity of radiation thermally emitted from a first surface of a workpiece. The method further includes identifying a present temperature of the first surface, in response to the present intensity and at least one previous thermal property of the first surface, at a respective previous time.

The workpiece may include a semiconductor wafer. If so, the first surface may include a device side of the wafer, and the second surface may include a substrate side of the wafer. In such an embodiment, identifying may include identifying the present temperature of the device side while the device side is being irradiated, or more particularly, while the device side is being exposed to an irradiance flash having a duration less than a thermal conduction time of the wafer. The irradiance flash may have a duration less than 10 milliseconds, such as a duration on the order of one millisecond, for example.

The method may include identifying, at the previous time, the at least one previous thermal property of the first surface. The at least one previous thermal property may include a previous temperature of the first surface, such as a previous temperature of the device side of the wafer immediately preceding commencement of the irradiance flash, for example. The at least one previous thermal property may further include a previous intensity of radiation thermally emitted from the device side immediately preceding commencement of the irradiance flash.

Thus, identifying may include identifying the present temperature of the first surface in response to the present intensity, a previous temperature of the first surface, and a previous intensity of radiation thermally emitted from the first surface at the previous time.

The previous temperature of the first surface may be identified in response to a previous temperature of a second surface of the workpiece unequal to the previous temperature of the first surface. If so, the first surface temperature may be identified in response to the previous second surface temperature and a temperature history of the workpiece. For example, the previous temperature of the second surface and the temperature history may be used to address a look-up table record.

The method may further including identifying, at the previous time, the previous temperature of the second surface. For example, the previous temperature of the second surface may be identified in response to a hemispherical reflectivity of the second surface.

The method may further include measuring the hemispherical reflectivity. This may include receiving radiation reflected by the second surface at a detector positioned sufficiently far away from the second surface to avoid obstructing the second surface from fields of view of other devices of a system in which the workpiece is located. Similarly, this may include receiving radiation reflected by the second surface at a detector positioned a distance from a center of the second surface, the distance being at least as great as one-half of the largest dimension of the workpiece.

Measuring the hemispherical reflectivity of the second surface may include measuring a directional reflectivity of the second surface, and may then include applying a scattering correction to the directional reflectivity to obtain the hemispherical reflectivity. The method may further include generating the scattering correction.

The previous temperature of the second surface may be identified in response to the hemispherical reflectivity of the second surface and radiation thermally emitted by the second surface.

The method may include repeatedly identifying and storing successive values of the previous temperature of the second surface at successive respective times, to generate the temperature history of the workpiece.

The method may also include repeatedly identifying successive values of the present temperature of the first surface in response to successive respective values of the present intensity of radiation thermally emitted by the first surface. Such values may be repeatedly identified while the first surface is being irradiated, or more particularly, while the first surface is being exposed to an irradiance flash having a duration less than a thermal conduction time of the workpiece.

Measuring the present intensity of radiation thermally emitted from the first surface may include measuring in a wavelength band in which an irradiance spectrum incident upon the first surface has negligible intensity. The method may include removing the wavelength band from the irradiance spectrum incident upon the first surface.

Similarly, measuring the directional reflectivity of the second surface may include measuring reflected intensity in an illumination wavelength band in which a heating irradiance spectrum incident upon the second surface has negligible intensity. The method may further include removing the illumination wavelength band from the heating irradiance spectrum.

In accordance with another aspect of the invention, there is provided a method of heat-treating a workpiece. The method includes a temperature measurement method such as that described in connection with the previous aspect of the invention, for example. The method further includes controlling a power of an irradiance flash incident on the first surface of the workpiece, in response to the present temperature of the first surface. This may include controlling power supplied to at least one irradiance source operable to produce the irradiance flash. Controlling power may include activating one of a plurality of irradiance sources only if the present temperature of the first surface is less than a pre-defined threshold.

In accordance with another aspect of the invention, there is provided a temperature measurement system. The system includes a measurement device configured to measure a present intensity of radiation thermally emitted from a first surface of a workpiece. The system further includes at least one processor circuit in communication with the measurement device, the at least one processor circuit configured to identify a present temperature of the first surface, in response to the present intensity and at least one previous thermal property of the first surface.

The system may include various measurement devices, such as imaging devices and radiometers, for example, as described in greater detail herein. Such devices may include high-speed InGaAs photodiodes and/or photodiode arrays, for example. The at least one processor circuit may be configured to cooperate with the various devices of the system to carry out the methods described herein.

In accordance with another aspect of the invention, there is provided a system for heat-treating a workpiece. The system includes a temperature measurement system as described above, and further includes an irradiance system operable to expose the first surface of the workpiece to an irradiance flash incident thereon. The at least one processor circuit is configured to control a power of the irradiance flash in response to the present temperature of the first surface.

In accordance with another aspect of the invention, there is provided a temperature measurement system. The system includes means for measuring a present intensity of radiation thermally emitted from a first surface of a workpiece. The system further includes means for identifying a present temperature of the first surface, in response to the present intensity and at least one previous thermal property of the first surface at a respective previous time.

The system may further include means for carrying out various respective functions disclosed herein.

In accordance with another aspect of the invention, there is provided a system for heat-treating a workpiece. The system includes means as described above, and further includes means for controlling a power of an irradiance flash incident on the first surface of the workpiece, in response to the present temperature of the first surface.

Certain specific embodiments of the present invention may provide ways to obtain accurate temperature measurements of the device side of the wafer during the course of the flash. These accurate temperature measurements may then be used for feedback-control of the power of the flash, if desired, to ensure consistency of the flash and the resulting annealing process from wafer to wafer. Alternatively, even if such temperature measurements are not used for feedback-control, they may be useful in identifying system "drift", or inconsistencies developing between successive executions of thermal processes that are supposed to be identical. Identification of such inconsistencies at an early stage may allow the users of the system to correct the inconsistencies as they are developing, rather than processing a large number of wafers only to discover that poor reproducibility control of the thermal processing cycle has led to detrimental performance differences from wafer to wafer.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
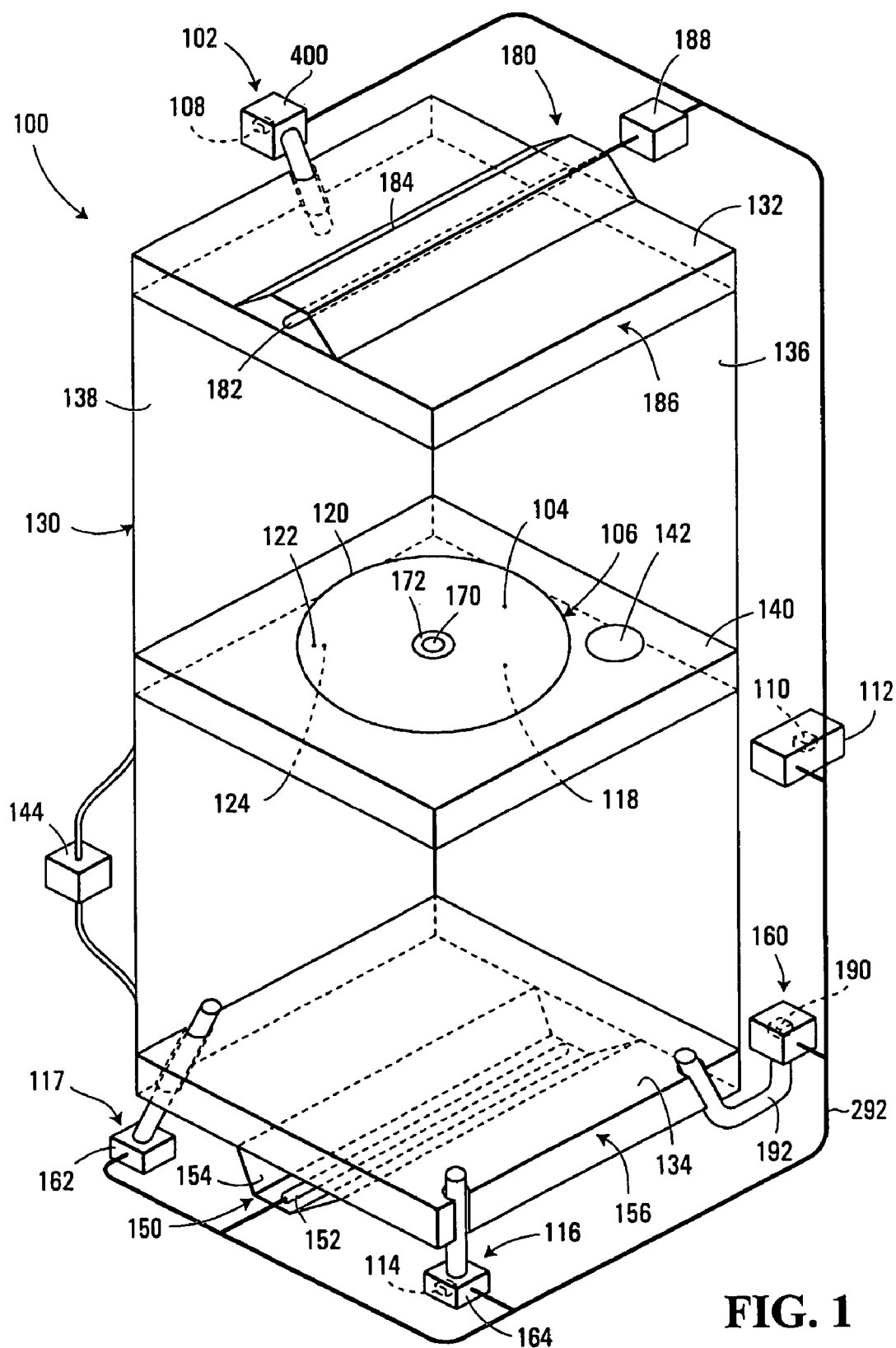
FIG. 1 is a perspective view of a system for temperature measurement and for heat-treating a workpiece, according to a first embodiment of the invention, shown with two vertical front-side walls removed.

Referring to FIG. 1, a temperature measurement system according to a first embodiment of the invention is shown generally at 100. In this embodiment, the system 100 includes a measurement device 102 configured to measure a present intensity of radiation thermally emitted from a first surface 104 of a workpiece 106. The system 100 further includes at least one processor circuit in communication with the measurement device 102. The at least one processor circuit is configured to identify a present temperature of the first surface 104, in response to the present intensity and at least one previous thermal property of the first surface at a respective previous time.

In this embodiment, the at least one processor circuit includes a processor circuit 108. In the present embodiment, the processor circuit 108 is located within a housing of the measurement device 102, although alternatively, the processor circuit may be located remotely from the measurement device if desired. In this embodiment, the at least one processor circuit also includes a processor circuit 110 located within a rapid thermal processing system computer (RSC) 112, and a processor circuit 114 located within a housing of an additional measurement device 116. Alternatively, the various functions described herein may be performed by a single processor circuit if desired, or by other combinations of local and/or remote processor circuits.

As discussed in greater detail herein, in the present embodiment the at least one processor circuit is configured to identify, at the previous time, the at least one previous thermal property of the first surface 104. More particularly, in this embodiment the at least one previous thermal property includes a previous temperature of the first surface. To achieve this, in the present embodiment the at least one processor circuit is configured to identify the previous temperature of the first surface 104 in response to a previous temperature of a second surface 118 of the workpiece 106 unequal to the previous temperature of the first surface 104 (although alternatively, in other embodiments, the previous temperature of the second surface may approximately equal the temperature of the first surface, for example, if the workpiece is pre-heated at a slower rate). More particularly, in this embodiment the at least one processor circuit is configured to identify the previous temperature of the first surface 104 in response to the previous temperature of the second surface 118 and a temperature history of the workpiece 106. In the present embodiment, the at least one processor circuit is also configured to identify, at the previous time, the previous temperature of the second surface 118, in response to a hemispherical reflectivity of the second surface.

Rapid Thermal Processing Chamber

In the present embodiment, the system 100 is also used for heat-treating the workpiece 106. In this embodiment, the workpiece 106 includes a semiconductor wafer 120. More particularly, in this embodiment the wafer 120 is a 300 mm diameter silicon semiconductor wafer for use in the manufacture of semiconductor chips, such as microprocessors, for example. In the present embodiment, the first surface 104 of the workpiece 106 includes a top-side or device side 122 of the wafer 120. Similarly, in this embodiment the second surface 118 of the workpiece includes a back-side or substrate side 124 of the wafer 120.

In this embodiment, to carry out such heat-treating of the wafer 120, the wafer is supported within a rapid thermal processing chamber 130, which effectively acts as a selectively-absorbing chamber. In this embodiment, the chamber 130 is somewhat similar to that disclosed in commonly-owned U.S. Pat. No. 6,303,411 (which is incorporated herein by reference), but includes radiation-absorbing regions both above and below the workpiece, rather than a combination of an absorptive and a reflective region. The selectively radiation-absorbing chamber 130 includes top and bottom selectively radiation-absorbing walls 132 and 134, as well as side walls, two of which are shown at 136 and 138 and the other two of which are removed for illustrative purposes. In this embodiment, the side walls 136 and 138 (as well as the further side walls not shown) include specularly reflective diamond-turned aluminum surfaces, however, they cooperate with the top and bottom walls 132 and 134, which include selectively absorbing water-cooled windows (discussed in greater detail below), to effectively act as radiation-absorbing regions at selected wavelengths.

In this embodiment, the chamber 130 further includes an internal wall 140 having respective cavities in which the workpiece 106 and a reference piece 142 are supported. In this embodiment, the workpiece is supported in its cavity by a plurality of quartz pins (not shown). If desired, the quartz pins may be provided in conjunction with a support system (not shown, not part of this invention), for supporting the workpiece in a manner such as those described in a commonly-owned United States provisional patent application being filed approximately concurrently with the present application, entitled "Methods and Systems for Supporting a Workpiece and for Heat-Treating the Workpiece", in the names of inventors Camm, Sempere, Kaludjercic, Stuart, Bumbulovic, and Rudolph.

The internal wall 140 may be either radiation-absorbing or reflective, depending on the particular application, with the reflective surface being more energy-efficient, but a radiation-absorbing surface resulting in greater uniformity of heating. Alternatively, a compromise between these extremes may be provided, such as a partly reflective, partly absorptive surface, such as anodized aluminum, for example. Similarly, if desired, the various reflective surfaces of the chamber 130 may be replaced by fully or partly radiation-absorbing surfaces. All of the surfaces of the chamber are preferably cooled via a cooling system 144, which in this embodiment includes a circulated water cooling system.

In this embodiment, the reference piece 142 is a small diamond-turned, specularly reflective aluminum mirror. Alternatively, the reference piece may be made of a silicon semiconductor material similar to that of the wafer 120, but in such a case, the reference piece 142 would preferably be relatively homogeneous, and would not include a device side. Alternatively, other types of reference pieces may be substituted.

In this embodiment, the system 100 further includes a pre-heating device 150 for pre-heating the wafer 120. In this embodiment the pre-heating device 150 includes a high-intensity arc lamp 152 and a reflector system 154 disposed beneath the bottom wall 134 of the chamber 130. In this embodiment, the bottom wall 134 effectively includes a filter through which the arc lamp 152 and the reflector system 154 of the pre-heating device 150 are operable to project electromagnetic radiation to heat the wafer 120. More particularly, in this embodiment the bottom wall 134 includes a water-cooled window 156. More particularly still, in this embodiment the water-cooled window 156 includes two parallel spaced-apart quartz panes defining a cooling channel therebetween, through which water is pumped by the cooling system 144.

As water tends to absorb infrared radiation at 1450 nm, and quartz also tends to absorb longer-wavelength infrared, the water-cooled window 156 serves two main purposes. Firstly, it acts as a filter that removes, from the irradiance spectrum produced by the pre-heating device, all radiation at a diagnostic wavelength, which in this embodiment is 1450nm. In other words, the water-cooled window effectively renders the radiation spectrum produced by the pre-heating device (or any reflections thereof by the workpiece) invisible to all measuring devices in the system 100 that detect radiation at the diagnostic wavelength. Secondly, it absorbs infrared radiation thermally emitted by the wafer 120 as it becomes hot, thereby preventing such radiation from reflecting back to the wafer 120 and causing undesirable (and non-uniform) heating thereof at inopportune times, such as during a cooling stage, for example. (In practice, it has been found that a small amount (e.g. 3%) of the radiation thermally emitted by the wafer 120 at the 1450 nm diagnostic wavelength may be inadvertently reflected back to the wafer by the top quartz pane of the window, rather than passing through the top pane to be absorbed in the water-cooling channel defined between the quartz panes. This latter effect is referred to as chamber return, and may be taken into account in the calibration of the various measuring devices employed in the system 100, if desired.)

In the present embodiment, the system 100 further includes a plurality of additional measurement devices, including a diagnostic illumination source 160, and radiation detectors. More particularly, in this embodiment the radiation detectors include the second measurement device 116, which in this embodiment includes a fast radiometer 164. Similarly, the radiation detectors further include another measurement device 117, which in this embodiment includes an imaging device 162. Generally, in this embodiment the diagnostic illumination source 160 and the imaging device 162 are used to capture images of the second surface 118 of the workpiece 106 and of the reference piece 142 to determine the hemispherical reflectivity of the workpiece, and the fast radiometer 164 is used to measure thermal emission from the workpiece. The thermal emission and hemispherical reflectivity measurements may be combined to yield the temperature of the second surface 118 of the workpiece, as discussed in greater detail below.

In this embodiment, the reference piece 142 is tilted slightly relative to the plane of the workpiece 106, and the diagnostic illumination source 160 and the imaging device 162 are angled so that both the reference piece and the workpiece reflect incident radiation from the diagnostic illumination source toward the imaging device 162 at an angle of maximum reflective intensity. If desired, the diagnostic illumination source 160, the imaging device 162 and the radiometer 164 may be disposed at equal angles relative to a central region 170 of the wafer 120. Such a configuration may reduce measurement errors in embodiments such as the present embodiment, where the second surface 118 of the workpiece 106 is not isotropically diffuse (Lambertian). Alternatively, however, the devices 160, 162 and 164 may be disposed at different angles, at the expense of increased measurement errors in any embodiment where the workpiece is not radially symmetric about the normal of the workpiece at its center. In the present embodiment, the devices 160, 162 and 164 are all positioned so as to bypass the water-cooled window 156, so that the water-cooled window 156 does not filter illuminating radiation produced by the diagnostic illumination source 160, nor does it filter radiation received by the imaging device 162 or the fast radiometer 164.

In the present embodiment, the system 100 further includes an irradiance system 180 operable to expose the first surface 104 of the workpiece 106 to an irradiance flash incident thereon. More particularly, in this embodiment the irradiance system 180 includes a flash lamp 182 and a reflector system 184, positioned immediately above the upper wall 132 of the chamber 130. Alternatively, a plurality of flash lamps may be employed if desired, or other suitable types of irradiance devices may be substituted for the flash lamp. In this embodiment, the upper wall 132 includes a water-cooled window 186, similar to the water-cooled window 156 discussed above, which acts as a filter for removing radiation at the diagnostic wavelength of 1450 nm from the irradiance spectrum produced by the flash lamp 182, and for absorbing thermal emission from the wafer at this wavelength. In the present embodiment, the irradiance system 180 further includes a power control system 188 for supplying electrical power to the flash lamp 182 to produce the irradiance flash.

In this embodiment, prior to the insertion of the wafer 120 into the chamber 130, the device side 122 of the wafer is subjected to an ion implantation process, which introduces impurity atoms or dopants into a surface region of the device side of the wafer. The ion implantation process damages the crystal lattice structure of the surface region of the wafer, and leaves the implanted dopant atoms in interstitial sites where they are electrically inactive. In order to move the dopant atoms into substitutional sites in the lattice to render them electrically active, and to repair the damage to the crystal lattice structure that occurs during ion implantation, it is necessary to anneal the surface region of the device side of the wafer by heating it to a high temperature.

In the present embodiment, such annealing is carried out according to methods such as those disclosed in the aforementioned commonly-owned PCT publication numbers WO 02/47143 and WO 02/47123. For example, a first stage of the annealing method may include pre-heating the wafer to an intermediate temperature, at a rate that is slower than a thermal conduction time through the wafer, so that the entire wafer is heated relatively uniformly to the intermediate temperature. In this embodiment, this pre-heating stage is achieved by irradiating the back-side or substrate side 124 of the wafer with the arc lamp 152, to heat the wafer at a ramp rate such as 100° C. per second to 400° C. per second, to an intermediate temperature such as 500° C. to 1100° C., for example. Following the pre-heating stage, the top-side or device side 122 of the wafer is rapidly heated to a substantially higher annealing temperature, at a rate much faster than the thermal conduction time through the wafer, so that only the top-side surface region of the wafer is heated to the final annealing temperature, while the bulk of the wafer remains close to the relatively cooler intermediate temperature. In this embodiment, this second stage is achieved by exposing the top-side surface to a high-power flash from the irradiance system 180, for a relatively short duration, on the order of one millisecond, for example. The cooler bulk of the wafer then acts as a heat sink to facilitate rapid cooling of the top-side surface.

In order to ensure adequate thermal processing of such wafers, and to achieve consistent thermal processing of similar wafers successively processed in the chamber 130, it is desirable to monitor the device side temperature during the second stage, i.e., during the rapid irradiance flash, in real-time, as discussed in greater detail herein. In some cases, if physical parameters of the irradiance system 180 tend to vary over time, consistency of thermal processing may be enhanced by using such real-time device side temperature values to control the power of the irradiance flash while it is occurring. Thus, in the present embodiment, the at least one processor circuit is configured to control a power of the irradiance flash in response to the present temperature of the first surface 104 of the workpiece 106, as discussed in greater detail below.

Substrate Side Pre-Heating Device

In the present embodiment, the arc lamp 152 is a 500 kW double water wall argon plasma arc lamp available from Vortek Industries Ltd. of Vancouver, British Columbia, Canada. An example of such an arc lamp is disclosed in commonly-owned Patent Cooperation Treaty application publication No. WO 01/54166, which is incorporated herein by reference. Such arc lamps provide numerous advantages for semiconductor annealing as compared to tungsten filament lamp sources, as discussed in the above-mentioned PCT publication. For larger temperature increases, multiple arc lamps may be substituted for the single arc lamp 152. Alternatively, however, other types of pre-heating devices, including flash lamps and even tungsten filament lamp sources or arrays of such lamp sources, for example, may be substituted.

Diagnostic Illumination Source

In this embodiment, the diagnostic illumination source 160 is operable to produce a diagnostic flash at the diagnostic wavelength of 1450 nm for illuminating the wafer 120 and the reference piece 142. To achieve this, the diagnostic illumination source 160 includes a short-arc xenon arc lamp 190 having a pulsed discharge power supply unit (not shown) for causing the arc lamp 190 to function as a flash lamp, and an incoherent optical fiber bundle 192, which bypasses the water-cooled window 156 of the lower wall 134 of the chamber 130. Radiation from the arc lamp 190 is channeled through the incoherent optical fiber bundle 192, bypassing the filter water-cooled window 156, thus allowing radiation at the diagnostic wavelength to illuminate the substrate side 124 of the wafer 120 and the reference piece 142 with a diagnostic flash at the diagnostic wavelength, whenever required for measurement purposes. Alternatively, however, any other suitable configuration for producing such a diagnostic flash may be substituted. For example, a continuous illumination source, such as one or more tungsten filament lamps for example, may be used in conjunction with a mechanical shutter (not shown) operable to rapidly open and shut to illuminate the wafer and reference piece. If so, the shutter is preferably radiation-absorbing and cooled. As a further illustrative example, one or more photodiodes or laser diodes emitting at the diagnostic wavelength of 1450 mn may be substituted for the arc lamp 190.

Imaging Device

Generally, in this embodiment, the measurement device 117, or more particularly the imaging device 162, is in communication with the at least one processor circuit, which is configured to cooperate with the imaging device to measure the hemispherical reflectivity of the second surface 118 of the workpiece 106. More particularly, in this embodiment the imaging device 162 acts as a radiation detector configured to receive radiation reflected by the second surface 118, the detector being positioned sufficiently far away from the second surface to avoid obstructing the second surface from fields of view of other devices of the system, such as the fast radiometer 164 and the diagnostic illumination source 160, for example. To achieve this, in the present embodiment the imaging device is positioned a distance from a center of the second surface 118 at least as great as one-half of the largest dimension of the workpiece 106. The imaging device is configured to measure a directional reflectivity of the second surface, and the at least one processor circuit is configured to apply a scattering correction to the directional reflectivity to obtain the hemispherical reflectivity, as discussed in greater detail below. Thus, the imaging device 162 is advantageous as compared to conventional devices for measuring hemispherical reflectivity, which typically must be placed very close to the measured object, such as integrating hemispheres, for example.

In this embodiment, the imaging device 162 includes an infrared camera operable to produce images of both the workpiece 106 and the reference piece 142, which are both within the field of view of the imaging device 162. In the present embodiment, the infrared camera includes a diode array, or more particularly, a photodiode focal plane array. More particularly still, in this embodiment the infrared camera includes a 320×256 pixel Indium-Gallium-Arsenide (In-GaAs) photodiode array, which has a 12-bit sensitivity. The camera also includes focusing optics (not shown), and further includes a narrow-band filter centered about 1450 nm, so that the camera is sensitive only to the diagnostic wavelength of 1450 nm and a very narrow bandwidth (e.g. ±15 nm) centered thereabout. Thus, in this embodiment the imaging device 162 is configured to measure the directional reflectivity of the second surface 118 of the workpiece in an illumination wavelength band in which a heating irradiance spectrum incident upon the second surface has negligible intensity. In this regard, it will be recalled that the system 100 effectively includes a filtering device configured to remove the illumination wavelength band from the heating irradiance spectrum. (More particularly, in this embodiment the filtering device includes the water-cooled window 156 interposed between the second surface 118 and the source of the heating irradiance spectrum, i.e., the arc lamp 152, as the water-cooled window blocks the entire diagnostic wavelength band of 1450±15 nm to which the imaging device 162 is sensitive). Alternatively, other imaging devices, such as other two- or one-dimensional diode arrays, or charge-coupled devices (CCDs) for example, may be substituted.

Figure 2:
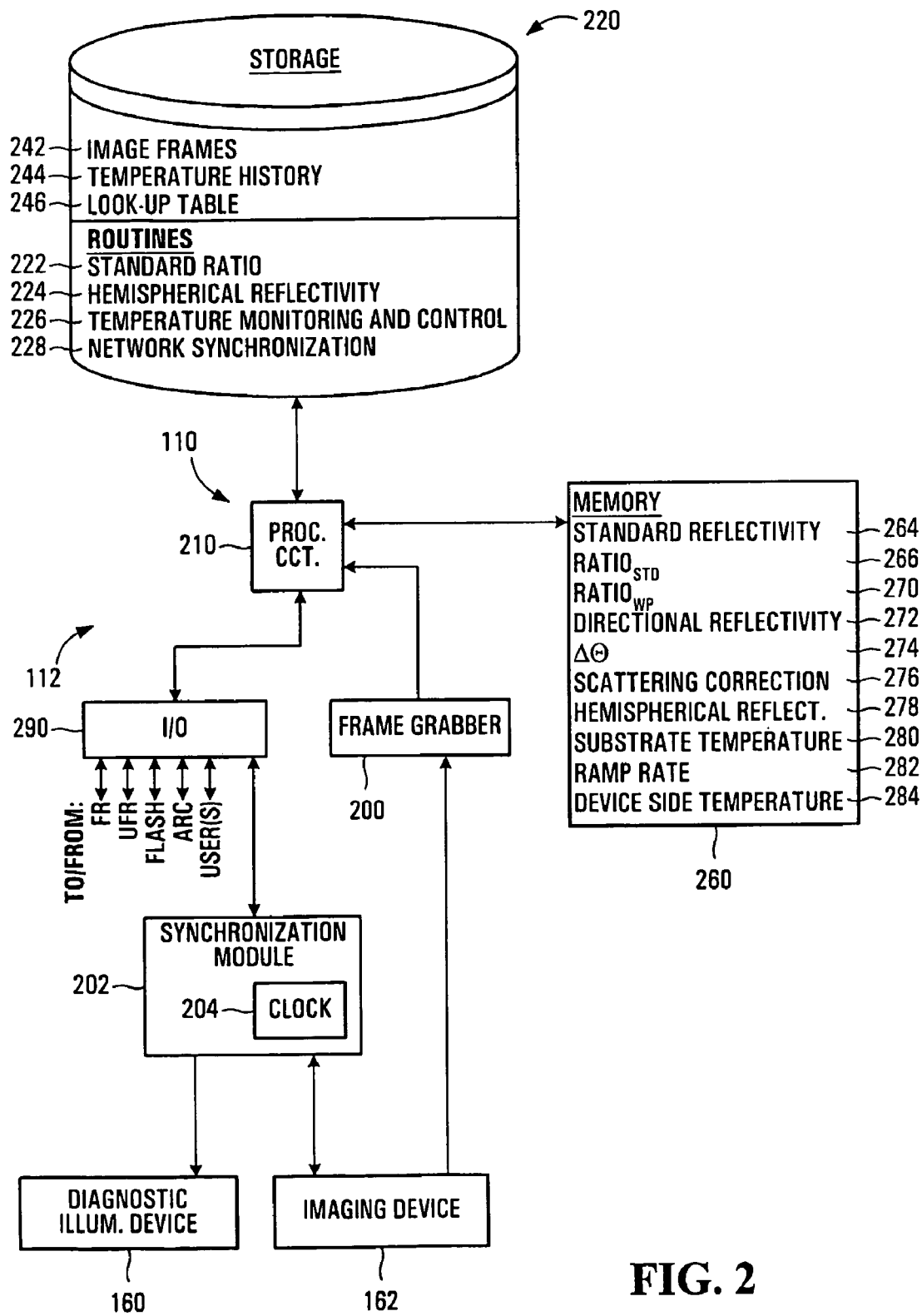
FIG. 2 is a block diagram of a rapid thermal processing system computer (RSC), a diagnostic illumination source, an imaging device, and a synchronization module, of the system shown in FIG. 1.

Referring to FIGS. 1 and 2, in this embodiment the imaging device 162 is in communication with a digital frame grabber card 200 of the RTP System Computer (RSC) 112, for communicating digital data representing images of the workpiece 106 and the reference piece 142 to the processor circuit 110 of the RSC 112. Alternatively, if desired, the imaging device may be placed in communication with a separate processor circuit remote from the RSC 112 and in communication therewith.

If desired, in addition to using such digital image data to determine the hemispherical reflectivity of the workpiece 106 in order to measure its temperature, such image data may also be used to produce real-time two-dimensional temperature maps of the second surface 118 of the workpiece 106. These temperature maps are useful for determining the uniformity of the heating of the workpiece during the entire thermal process. Spatially resolved temperature maps are discussed in greater detail in the aforementioned commonly-owned U.S. Pat. No. 6,303,411, for example.

In this embodiment, the imaging device 162 and the diagnostic illumination source 160 are also in communication with a synchronization module 202.

Synchronization Module

Referring to FIGS. 1 and 2, in this embodiment, the synchronization module 202 is used to synchronize the imaging device 162 with the diagnostic illumination source 160, to enable the imaging device 162 to produce images of the workpiece 106 and the reference piece 142 when illuminated by the diagnostic flash (as well as prior to and/or following the diagnostic flash, if desired).

To achieve this, the synchronization module 202 receives a video frame sync signal from the imaging device 162, in response to which it generates a pulse signal with an adjustable delay, to activate the diagnostic illumination source 160 at the desired time. If desired, different types of video frame sync signals can be selected, such as composite analog video, standard TTL video and LVDS differential digital video, for example.

To generate the adjustably delayed pulse signal to activate the diagnostic illumination source 160 in response to the video frame sync signal from the imaging device 162, the synchronization module 202 includes an internal clock 204, which in this embodiment is a 48 MHz clock, and is capable of generating "on" and "off" delay signals with adjustable delays ranging from 0 to 99,999 microseconds with a 1-microsecond resolution, and delay accuracy better than 40 nanoseconds. In this embodiment, the synchronization module 202 generates an "on" pulse signal to activate the diagnostic illumination source 160 immediately prior to the commencement of the integration period of the imaging device 162, to ensure that the imaging device 162 captures reflected radiation from the workpiece and reference piece when the diagnostic illumination source is illuminating the workpiece and reference piece at its peak intensity, thereby maximizing the signal-to-noise ratio of the resulting digital reflectance images.

RTP System Computer (RSC)

Referring to FIGS. 1 and 2, the RTP System Computer (RSC) is shown in greater detail at 112 in FIG. 2. In this embodiment, the RSC includes the processor circuit 110, which in the present embodiment includes a microprocessor 210. More generally, however, in this specification, the term "processor circuit" is intended to broadly encompass any type of device or combination of devices capable of performing the functions described herein, including (without limitation) other types of microprocessors, microcontrollers, other integrated circuits, other types of circuits or combinations of circuits, logic gates or gate arrays, or programmable devices of any sort, for example, either alone or in combination with other such devices located at the same location or remotely from each other, for example. Additional types of processor circuits will be apparent to those ordinarily skilled in the art upon review of this specification, and substitution of any such other types of processor circuits is considered not to depart from the scope of the present invention as defined by the claims appended hereto.

In the present embodiment, the microprocessor 210 is in communication with a storage device 220, which in this embodiment includes a hard disk drive. The storage device 220 is used to store a plurality of routines that configure or program the microprocessor 210 to perform various functions described herein, including a standard ratio routine 222, a hemispherical reflectivity routine 224, a temperature monitoring and control routine 226, and a network synchronization algorithm 228. Generally, the network synchronization algorithm 228 is employed by the processor circuit 110 to regulate network communications between the RSC 112 and various other devices of the system 100, to ensure that non-deterministic latency is less than 50 μs. The remaining routines are discussed in greater detail below.

In this embodiment, the storage device 220 is also used to store various types of data received or used by the microprocessor 210. More particularly, in the present embodiment the storage device 220 includes an image frames store 242 for storing digital data representing images of the workpiece 106 and the reference piece 142 received from the imaging device 162, a temperature history store 244 for storing workpiece temperature values received from the fast radiometer 164, and a look-up table store 246 for storing a look-up table used by the microprocessor 210 to identify a temperature of the first surface 104 of the workpiece 106, in response to a temperature of the second surface 118 unequal to the temperature of the first surface, and the temperature history of the workpiece.

In the present embodiment, the microprocessor 210 is also in communication with a memory device 260, which in this embodiment includes a random access memory (RAM). The memory device 260 is used by the microprocessor 210 for storage of values representing various physical properties identified or used by the microprocessor in the execution of the various routines stored in the storage device 220. More particularly, in this embodiment such routines direct the microprocessor 210 to define, in the RAM, a plurality of registers, including a standard reflectivity register 264, a standard ratio register 266, a workpiece ratio register 270, a directional reflectivity register 272, a scattering values register 274, a scattering correction register 276, a hemispherical reflectivity register 278, a substrate temperature register 280, a ramp rate register 282, and a device side temperature register 284, discussed in greater detail below.

In this embodiment, the microprocessor 210 is in communication with the digital frame grabber card 200, for receiving digital data representing infrared images of the workpiece 106 and the reference piece 142 produced by the imaging device 162.

The microprocessor 210 of the present embodiment is in further communication with an input/output (I/O) interface 290, for communicating with various devices of the system 100 shown in FIG. 1, including the fast radiometer 164, the measurement device 102, the irradiance system 180, the preheating device 150, a user-input device (not shown) such as a keyboard and/or a mouse, for example, and the synchronization module 202 for controlling the diagnostic illumination source 160 and the imaging device 162. In this embodiment, the I/O interface 290 includes an optical-electrical converter, for communicating with at least some of these devices (such as the fast radiometer 164 and the measurement device 102, for example) via a fiber optic network 292. In this regard, it will be appreciated that such optical communications avoid difficulties posed by electromagnetic interference and electrical noise resulting from large electrical currents and sudden electrical discharges required by the pre-heating device 150 and the irradiance system 180.

Fast Radiometer

Figure 3:
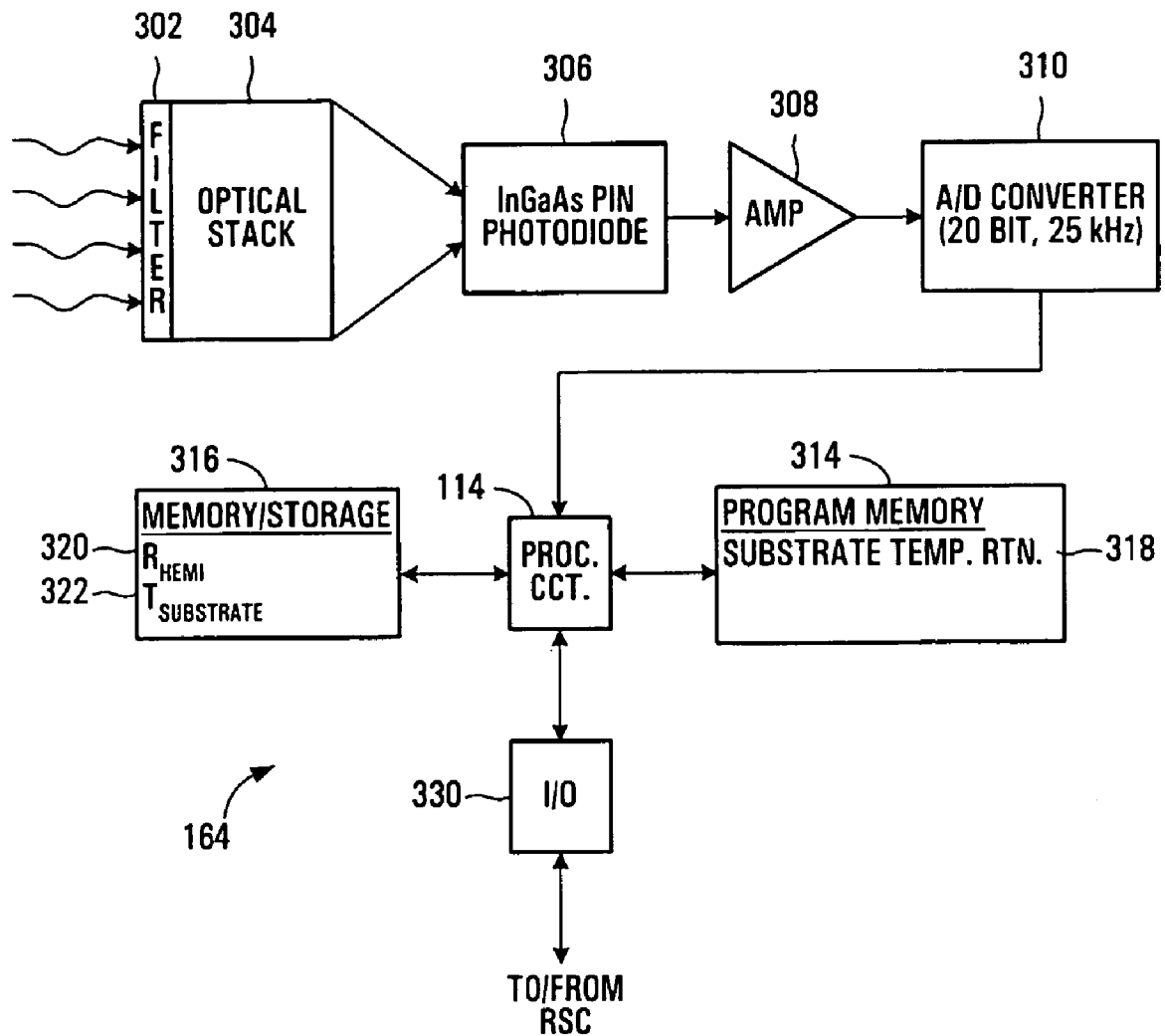
FIG. 3 is a block diagram of a fast radiometer of the system shown in FIG. 1.

Referring to FIGS. 1 and 3, the measurement device 116, or more particularly, the fast radiometer, is shown generally at 164 in FIG. 3. Generally, in this embodiment, the fast radiometer 164 receives electromagnetic radiation thermally emitted by the second surface 118 of the workpiece 106 at the diagnostic wavelength of 1450 nm, and produces corresponding emissivity-compensated temperature values representing the temperature of the second surface of the workpiece.

To achieve this, in the present embodiment the fast radiometer 164 includes a narrow-band filter 302 centered about the diagnostic wavelength of 1450 nm, for blocking wavelengths other than the diagnostic wavelength. The fast radiometer further includes an optical stack 304, for focussing electromagnetic radiation emitted from the central region 170 of the second surface 118 of the workpiece onto an active element of a photodiode 306, which in this embodiment includes a high-speed, low-noise, InGaAs PIN photodiode. In this embodiment, the central region 170 includes an area of approximately 2 cm in diameter at the center of the substrate side 124 of the wafer 120.

The photodiode 306 is in communication with an amplifier 308, which in this embodiment includes a differential transimpedance amplifier, having a 3 dB electrical bandwidth of approximately 2.5 kHz. The amplifier 308 conditions and amplifies the output signal from the photodiode, and supplies the amplified signal to an analog-to-digital (A/D) converter 310. In the present embodiment, the A/D converter 310 produces 20-bit samples of the amplified photodiode signal, at an over-sampling rate of 25 kHz.

The A/D converter 310 is in communication with the processor circuit 114 of the fast radiometer 164. The processor circuit 114 is in communication with first and second storage devices, which in this embodiment include a program memory 314 and a working memory 316. The program memory stores instruction codes or routines which configure the processor circuit 114 to perform various functions, including a substrate temperature routine 318, which directs the processor circuit 114 to identify the temperature of the substrate side 124 of the wafer 120, as discussed in greater detail below. The substrate temperature routine 318 directs the processor circuit 114 to define, in the working memory 316, a plurality of registers, including a hemispherical reflectivity register 320 and a substrate temperature register 322. The program memory 314 may include any suitable type of memory device, but is preferably a non-volatile memory, such as a ROM, an EPROM, an EEPROM or a FLASH memory, for example. Similarly, the working memory 316 may include any suitable type of memory device, such as a RAM, for example.

The processor circuit 114 is in communication with an input/output (I/O) interface 330, for communication with the processor circuit 110 of the RSC 112 shown in FIG. 1. In this embodiment, the I/O interface 330 includes an optical-electrical converter, for communicating with the RSC via the fiber-optic network 292. As discussed below, in this embodiment the fast radiometer 164 effectively measures the temperature of the substrate side 124 of the wafer 120 every millisecond, and supplies updated substrate temperature values to the RSC at a rate of 1 kHz. The fast radiometer 164 also periodically receives updated hemispherical reflectivity values from the RSC, which it combines with substrate side thermal emission intensity values to produce the substrate temperature values.

Device Side Irradiance System

Referring back to FIG. 1, generally, the irradiance system 180 is operable to irradiate the device side 122 of the wafer 120. The measurement device 102 and the at least one processor circuit are configured to measure the present intensity and identify the present temperature of the device side 122, while the device side is being irradiated by the irradiance system 180.

In this embodiment, the irradiance system 180 includes the flash lamp 182 (or a plurality of such flash lamps if desired) and the reflector system 184 shown in FIG. 1. More particularly in this embodiment the flash lamp 182 includes a high intensity arc lamp similar to that discloseu in the aforementioned commonly-owned Patent Cooperation Treaty application publication number WO 01/54166.

In the present embodiment, the irradiance system 180 is operable to expose the device side 122 to an irradiance flash having a duration less than a thermal conduction time of the wafer 120. In the present embodiment, the thermal conduction time of the wafer is on the order of 10 to 15 ms. Accordingly, in the present embodiment, the irradiance system 180 is operable to produce the irradiance flash to have a duration on the order of 10 milliseconds or less. More particularly, in this embodiment the irradiance system is operable to produce the irradiance flash to have a duration on the order of 1 millisecond.

To achieve this, in the present embodiment, the irradiance system 180 further includes the power control system 188 shown in FIG. 1. More particularly, in this embodiment the power control system 188 acts as a power supply system, and includes a pulsed discharge unit that may be pre-charged then abruptly discharged in order to supply a "spike" of input power to the flash lamp 182 to produce the desired irradiance flash. More particularly still, in the present embodiment the pulsed discharge unit includes a power supply model number VT-20 pulsed discharge unit manufactured by Rapp Opto-Electronic of Hamburg, Germany, operable to produce pulses of up to 60 kJ within discharge times ranging from approximately 0.5 to 5 ms, such as a one-millisecond discharge time, for example. In response to such a discharge, the flash lamp 182 is operable to produce a heating flash of electromagnetic radiation with a power output of 4-6 MW ranging from 0.5-5 ms in duration. Alternatively, much larger power supplies, operable to discharge 300 kJ for example, may be substituted. More generally, other heating devices may be substituted for the irradiance system 180 if desired.

In this embodiment, the power control system 188 includes a power control circuit interposed between the pulsed discharge unit and the flash lamp 182, for feedback control of the pulsed discharge, as discussed below.

Ultra-Fast Radiometer

Figure 4:
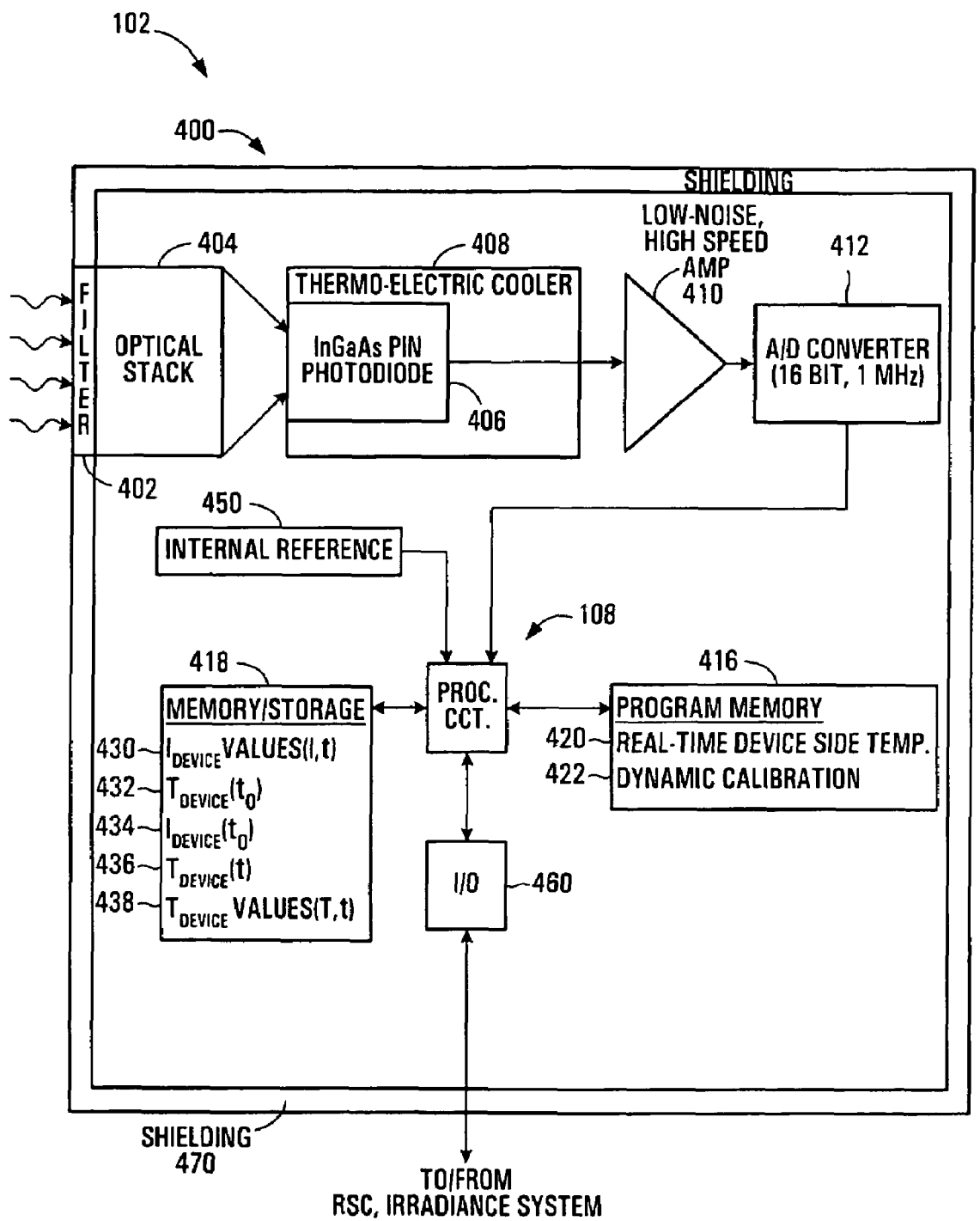
FIG. 4 is a block diagram of an ultra-fast radiometer of the system shown in FIG. 1.

Referring to FIGS. 1 and 4, the measurement device is shown generally at 102 in FIG. 4. In this embodiment, the measurement device 102 includes an ultra-fast radiometer 400. Generally, the ultra-fast radiometer acts as a measurement device configured to measure a present intensity of radiation thermally emitted from the first surface 104 of the workpiece 106. The ultra-fast radiometer also includes a processor circuit in communication with the measurement device, configured to identify a present temperature of the first surface 104, in response to the present intensity and at least one previous thermal property of the first surface 104, as discussed in greater detail herein. More particularly, in this embodiment the ultra-fast radiometer 400 is configured to cooperate with the at least one processor circuit to identify the temperature of the device side 122 of the wafer 120, during the rapid irradiance flash produced by the irradiance system 180. Such a flash may have a duration on the order of one millisecond, for example, and may raise the device side temperature by hundreds of degrees Celsius, for example. Accordingly, the ultra-fast radiometer 400 is designed to have a wide dynamic range and ultra-fast time response.

Referring to FIGS. 1, 3 and 4, in this embodiment, the ultra-fast radiometer 400 is similar in some (but not all) respects to the fast radiometer 164 shown in FIG. 3.

Thus, the ultra-fast radiometer 400 includes a 1450 nm narrow-band filter 402, an optical stack 404 and a high-speed InGaAs PIN photodiode 406, which in this embodiment are similar to the corresponding components 302, 304 and 306 of the fast radiometer. However, in this embodiment, the photodiode 406 includes an integrated thermoelectric cooler 408, for controlling the temperature of the photodiode 406 to within 20 milliKelvins.

The output signal from the photodiode 406 is supplied to an amplifier 410. In this embodiment, the amplifier 410 includes a very low noise, high-speed, differential transimpedance amplifier, having a 3 dB electrical bandwidth of 500 kHz. The amplifier 410 conditions and amplifies the photodiode output signal, and supplies the amplified signal to an analog-to-digital (A/D) converter 412. The A/D converter 412 produces 16-bit samples of the amplified photodiode signal, at a sampling rate of 1 MHz.

The A/D converter 412 is in communication with the processor circuit 108 of the ultra-fast radiometer 400. The processor circuit 108 is in communication with first and second storage devices, which in this embodiment include a program memory 416 and a memory device 418. The program memory 416 stores routines that configure the processor circuit 108 to perform various functions, including a real-time device side temperature routine 420, and a dynamic calibration routine 422. The real-time device side temperature routine 420 directs the processor circuit 108 to define, in the memory device 418, a plurality of registers and/or stores, including a device side thermal emission intensity store 430, an initial device side temperature register 432, an initial device-side thermal intensity register 434, a device side temperature register 436, and a device side temperature values store 438.

In this embodiment, the processor circuit 108 is in communication with an internal reference device 450. In this embodiment, the internal reference device is thermally controlled and highly stable, and is used to produce calibration and reference signals. The dynamic calibration routine 422 directs the processor circuit 108 to adjust the 16-bit samples received from the A/D converter 412 in response to the calibration and reference signals received from the internal reference device 450, in order to dynamically compensate for any unpredictable drift that may occur in the various electronic components of the ultra-fast radiometer.

In the present embodiment, the processor circuit 108 is in further communication with an input/output (I/O) interface 460, for communication with the processor circuit 110 of the RSC 112, and with other components of the system 100 shown in FIG. 1. In particular, in this embodiment the processor circuit 108 is in direct communication with the power control system 188 of the irradiance system 180, to enable the processor circuit 108 to control the power of the irradiance flash produced by the irradiance system, in response to the real-time device side temperature values obtained by the processor circuit 108 during the course of the flash. In this embodiment, the I/O interface 460 includes an optical-electrical converter, to enable such communications signals to be transmitted and received over the fiber optic network 292, thereby avoiding deleterious effects of electromagnetic interference and electrical noise, which may be significant in the temporal vicinity of the flash.

In this embodiment, the ultra-fast radiometer 400 further includes shielding 470, to reduce the influence of such interference on the various internal components of the ultra-fast radiometer.

Referring back to FIG. 1, in this embodiment, the measurement device 102, or more particularly the ultra-fast radiometer 400, is configured to measure the present intensity of thermal emission from the first surface 104 of the workpiece 106, in a wavelength band in which an irradiance spectrum incident upon the first surface has negligible intensity. To achieve this, in this embodiment, the system 100 effectively includes a filtering device configured to remove the wavelength band from the irradiance spectrum incident upon the first surface. More particularly, in this embodiment the filtering device includes the water-cooled window 186 interposed between the first surface 104 and a source of the irradiance spectrum, which in this embodiment is the irradiance system 180. In this regard, it will be recalled that the water-cooled window 186 serves to transmit most of the radiation produced by the flash lamp 182 to the device side 122 of the wafer 120 to heat the device side, while at the same time absorbing radiation at the diagnostic wavelength of 1450 nm.

Conversely, due to the effects of the 1450 nm narrow-band filter 402, the ultra-fast radiometer is responsive only to radiation in the immediate vicinity of 1450 nm. Therefore, the ultra-fast radiometer detects only thermal emissions from the device side 122, and does not detect any radiation produced by the irradiance system and reflected by the device side. The water-cooled window 186 also serves to absorb most of the radiation at wavelengths thermally emitted by the device side 122 (typically 1400 nm and longer), thereby preventing such wavelengths from being reflected back to the wafer which would tend to cause undesirable and non-uniform heating of the device side at inopportune times when cooling is desired. (The ultra-fast radiometer may, however, detect a small amount of "chamber return", i.e., a small percentage of the radiation thermally emitted by the device side at the diagnostic wavelength may be reflected by the lower quartz pane of the window 186 back to the device side, which may re-reflect a small portion of such reflected thermal emissions to the radiometer. Chamber return may be taken into account within the execution of the dynamic calibration routine 422, if desired.)

Operation

Figure 5:
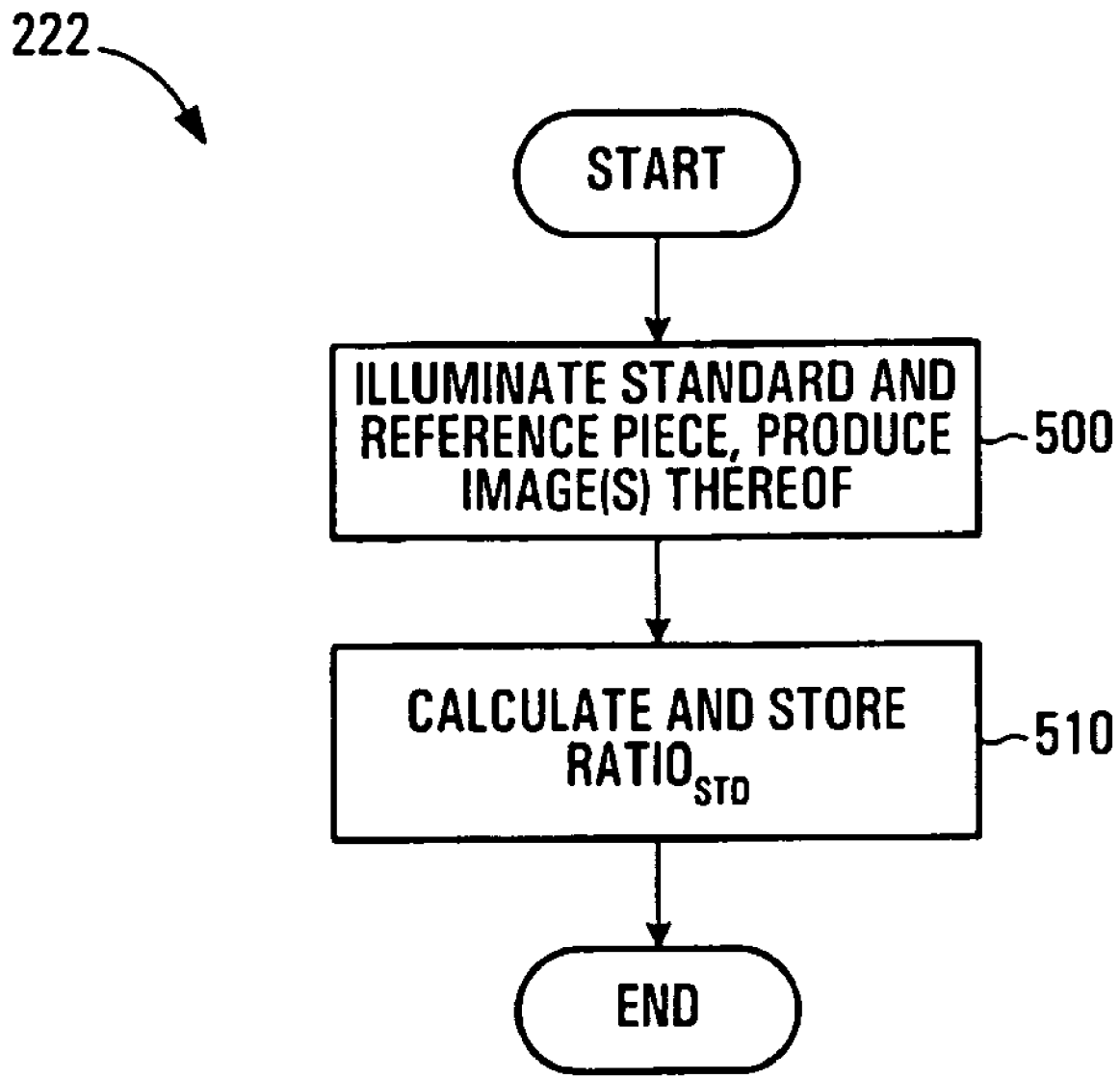
FIG. 5 is a flow chart of a standard ratio routine executed by a processor circuit of the RSC shown in FIG. 2.

Standard Ratio Routine:

Referring to FIGS. 1, 2 and 5, the standard ratio routine is shown at 222 in FIG. 5. Generally, the standard ratio routine 222 configures the processor circuit 110 of the RSC 112 to calculate a value $RATIO_{STD}$, which is subsequently used by the processor circuit 110 in the course of the hemispherical reflectivity routine 224 to identify the hemispherical reflectivity of the substrate side 124 of the wafer 120.

Prior to execution of the standard ratio routine, the wafer 120 is removed from the chamber 130, and is replaced with a standard having a known reflectivity $R_{STD}$. Thus, for this initial measurement, the workpiece 106 includes a standard rather than a semiconductor wafer. In this embodiment, the standard is an aluminum wafer, however, any suitable standard having a known reflectivity may be substituted. Once the standard has been placed in the chamber 130, the standard ratio routine may be executed.

The standard ratio routine 222 includes various blocks of instruction codes which configure the processor circuit 110 to identify and store the desired value RATIO$_{STD}$. The standard ratio routine 222 begins with a first block 500 of codes, which directs the processor circuit 110 to effectively obtain an illuminated image of the standard and of the reference piece 142. To achieve this, block 500 directs the processor circuit 110 to signal the synchronization module 202 shown in FIG. 2, in response to which the synchronization module receives the video sync signal from the imaging device 162 as described above. The synchronization module generates an electrical pulse signal to activate the diagnostic illumination source 160 immediately prior to the commencement of the integration period of the imaging device 162, so that the imaging device captures an image of the workpiece 106 (in this case the standard) and the reference piece 142 while these latter objects are being illuminated by the diagnostic illumination flash with maximum intensity. The imaging device 162 transmits signals representing the captured image of the standard and of the reference piece to the digital frame grabber card 200. The processor circuit 110 receives data from the frame grabber card representing the captured image, and stores the received data in the image frames store 242 in the storage device 220.

Block 510 then directs the processor circuit 110 to calculate the value RATIO$_{STD}$. In this regard, it will be appreciated that if the intensity of the diagnostic flash incident upon the reference piece is I$_0$, then the intensity of the diagnostic flash incident upon the workpiece 106 is αI$_0$, where α is a constant determined by the geometry of the system 100. Thus, the reference piece 142 reflects the diagnostic flash with an intensity I$_0$R$_{REF}$, where R$_{REF}$ is the reflectivity of the reference piece, and likewise, the workpiece 106, which in this case is the standard, reflects the diagnostic flash with intensity αI$_0$R$_{STD}$. The data values that were stored in the image frames store 242 at block 500 above, produced by the imaging device 162, or more particularly, by individual photodiodes of the InGaAs photodiode array corresponding to the central region 170 of the workpiece 106 and by photodiodes corresponding to the reference piece 142 (or alternatively, by corresponding pixels if a CCD is substituted for the photodiode array), are used to calculate and store a ratio of the intensity reflected by the workpiece (in this case, the standard) to the intensity reflected by the reference piece, namely, RATIO$_{STD}$=αI$_0$R$_{STD}$/I$_0$R$_{REF}$=αR$_{STD}$/R$_{REF}$. Block 510 then directs the processor circuit 110 to store the resulting value RATIO$_{STD}$ in the standard ratio register 266 in the memory device 260. The standard ratio routine is then ended.

The foregoing calculation of Ratio$_{STD}$ is calculated once, and typically does not need to be re-calculated for a given set of thermal cycles to be applied to similar wafers, unless a physical parameter of the system 100 changes (e.g., dirt on an illumination source). To determine whether or not Ratio$_{STD}$ should be recalculated, a "calibration wafer" or "diagnostic wafer" (for example, a semiconductor wafer having no devices and uniform dopant concentration) may be periodically thermally cycled in the system 100, and resulting dopant activation may be measured (for example, by measuring sheet resistance of the wafer). Alternatively, other factors may suggest a desire for recalculation of Ratio$_{STD}$, such as a movement of the image of the wafer, or drastic changes in temperature measurements in one cycle as compared to previous cycles, for example.

Temperature Monitoring and Control Routine

The remaining routines employ at least some information derived directly or indirectly from wafer reflectivity measurements. As the wafer 120 is not sufficiently opaque to the 1450 mn diagnostic wavelength at temperatures below about 700° C. for such reflectivity measurements to be reliably accurate for many purposes, the remaining routines are described only in the context of a thermal cycle in progress, where the wafer has reached or exceeded a threshold temperature at which it is sufficiently opaque for such measurements to be accurately made at the diagnostic wavelength. Alternatively, if desired, wafer reflectivity measurements may be obtained at shorter wavelengths, or may be predicted for the purpose of low-temperature measurements, if desired.

Figure 6:
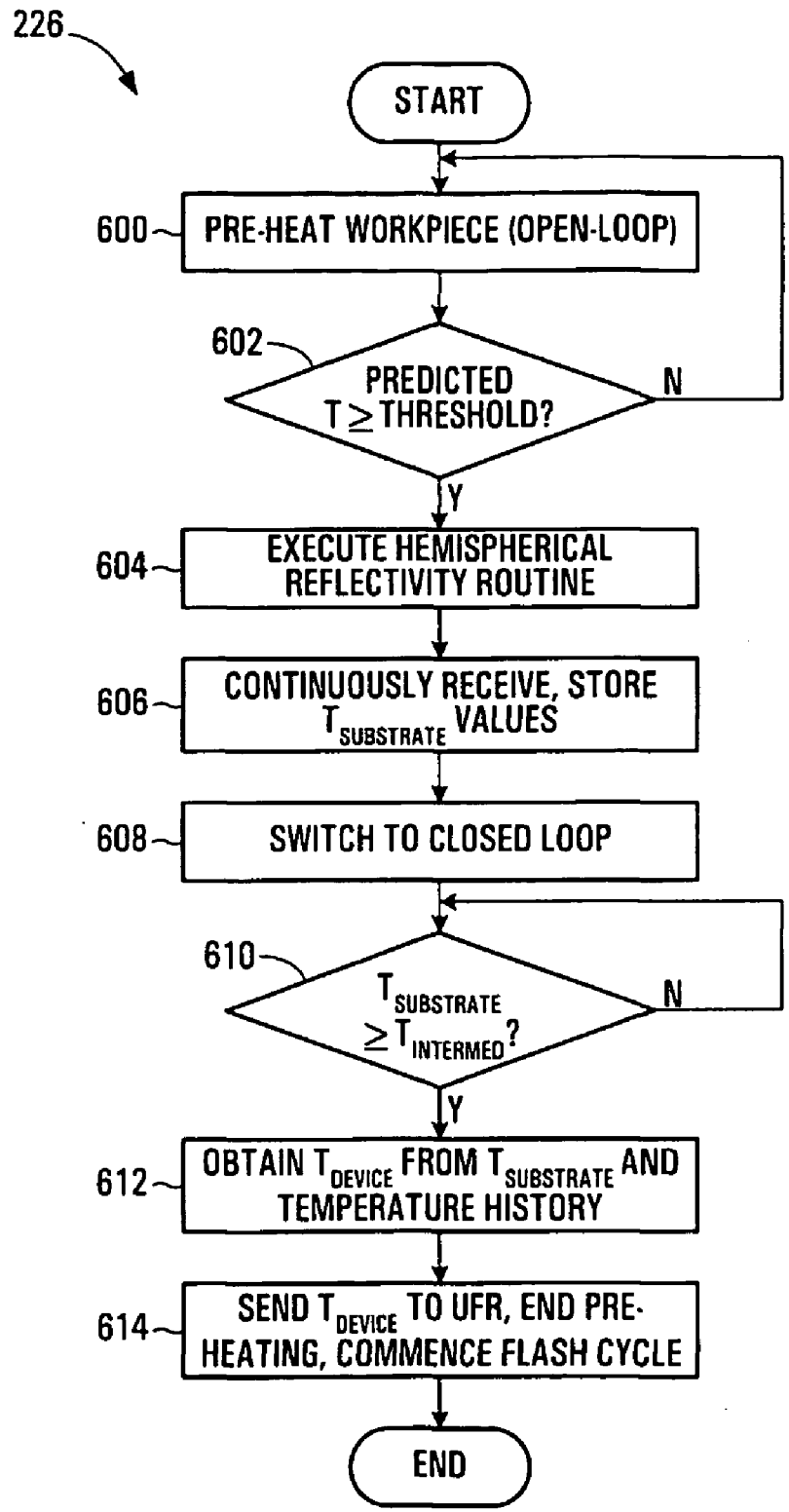
FIG. 6 is a flow chart of a temperature monitoring and control routine executed by the processor circuit of the RSC shown in FIG. 2.

Referring to FIGS. 1, 2 and 6, the temperature monitoring and control routine is shown at 226 in FIG. 6. Generally, the temperature monitoring and control routine 226 configures the processor circuit 110 of the RSC 112 to control the pre-heating device 150 to irradiate the substrate side 124 of the wafer 120, to pre-heat the wafer to a desired intermediate temperature at a ramp rate that is slow compared to a thermal conduction time of the wafer (as an arbitrary, illustrative example, such a ramp cycle may heat the wafer from room temperature to an intermediate temperature of 800° C. at a ramp rate of 250° C./second). When the intermediate temperature is reached, the temperature monitoring and control routine directs the processor circuit to control the irradiance system 180 to initiate a flash cycle, to heat the device side 122 of the wafer 120 to a desired annealing temperature, at a rate much faster than the thermal conduction time of the wafer (as a further arbitrary illustrative example, the device side may be exposed to a one-millisecond flash to heat the device side to a temperature of 1300° C., while the bulk of the wafer remains close to the intermediate temperature). Once the flash cycle has been initiated, the remainder of the flash cycle is controlled directly by the ultra-fast radiometer 400 under the direction of the real-time device side temperature routine 420.

The temperature monitoring and control routine 226 begins with a first block 600 of codes, which directs the processor circuit 110 to control the pre-heating device 150, or more particularly the arc lamp 152, to begin pre-heating the workpiece 106 at a desired ramp rate. Typically, for a silicon semiconductor wafer, the desired ramp rate is in the range of 100° C./second to 400° C./second, although other ramp rates outside this range may be substituted if desired. In this embodiment, due to the fact that silicon is not opaque to 1450 nm radiation when it is below about 700° C., the pre-heating cycle is initially commenced as an open-loop temperature cycle, based on predicted wafer temperatures that are expected to result from supplying predetermined amounts of energy to the arc lamp 152.

Block 602 then directs the processor circuit 110 to determine whether the predicted temperature of the workpiece 106 has reached a pre-defined threshold temperature. In this embodiment, where the workpiece is the semiconductor wafer 120, the pre-defined temperature is approximately 600° C., above which the wafer, although not yet completely opaque to the 1450 nm diagnostic wavelength, is sufficiently opaque to provide adequate signals for use by the temperature measurement and control routine. (As the wafer temperature increases beyond 700° C., it becomes completely opaque to the diagnostic wavelength, thereby improving the accuracy of the system.)

If at block 602 it is predicted that the threshold temperature has been achieved, block 604 directs the processor circuit 110 to commence execution of the hemispherical reflectivity routine 224 (discussed in greater detail below in connection with FIG. 7) to periodically identify the hemispherical reflectivity of the wafer, which in turn can be used by the fast radiometer 164 to produce emissivity-compensated temperature measurements of the wafer.

Block 606 then directs the processor circuit 110 to begin continuously receiving and storing temperature values from the fast radiometer 164, representing successive values of the temperature of the second surface 118 of the workpiece 106 (in this embodiment the substrate side 124 of the wafer 120) at successive respective times. Each such temperature value is produced by the processor circuit 114 of the fast radiometer 164, as discussed in greater detail below in connection with FIG. 8. Block 606 directs the processor circuit 110 to store each such received substrate temperature value, along with the current time, as a data pair ($T_{SUBSTRATE}$, t), in the temperature history store 244, to effectively generate a temperature history record of the wafer. Although block 606 is shown in FIG. 6 as a single block of instruction codes for ease of illustration, in this embodiment block 606 continues to direct the processor circuit to receive and store such substrate temperature values throughout the course of the pre-heating cycle, the subsequent flash cycle, and the radiative cooling stage thereafter.

Block 608 then directs the processor circuit 110 to switch to a closed-loop pre-heating cycle. More particularly, block 608 directs the processor circuit 110 to begin comparing the substrate temperature values received from the fast radiometer to the predicted or desired substrate temperatures for each corresponding time-point in the thermal cycle, and to increase or decrease the power supplied to the arc lamp 152 so as to minimize or eliminate any deviations of the actual (measured) substrate temperature from the desired or predicted temperature. If desired, the closed-loop pre-heating cycle may include spatially resolved irradiance control, such as any of the methods disclosed in the aforementioned commonly-owned U.S. Pat. No. 6,303,411, for example.

While block 606 and 608 continue to execute, block 610 directs the processor circuit 110 to compare the most recently received substrate temperature value to a pre-defined intermediate temperature at which the flash cycle is to be commenced.

If it is determined at block 610 that the intermediate temperature has been achieved, block 612 directs the processor circuit 110 to store the most recently received substrate temperature value $T_{DEVICE}(t_0)$ in the substrate temperature register 280 (if desired, the corresponding time value $t_0$ may also be stored). Block 612 then directs the processor circuit 110 to identify a thermal property of the first surface 104 of the workpiece 106, or more particularly, a temperature of the device side 122 of the wafer 120 immediately preceding commencement of the irradiance flash. In this embodiment, the temperature of the first surface 104 is identified in response to a temperature of the second surface 118 of the workpiece unequal to the temperature of the first surface 104. More particularly, the temperature of the first surface 104 is identified in response to the temperature of the second surface 118 and the temperature history of the workpiece 106. More particularly still, block 612 directs the processor circuit 110 to use the temperature of the second surface 118 and the temperature history to address a look-up table record in the look-up table store 246, to identify the temperature of the first surface 104.

In this embodiment, the look-up table stored in the look-up table store 246 has been previously pre-calculated and stored, using a thermal modelling routine (not shown), which in this embodiment includes TAS Thermal Analysis System software, available from Harvard Thermal, Inc. of Harvard, Mass., USA. To produce the look-up table, the TAS routine is provided with input data, which in this embodiment includes thermal properties (e.g., heat conductivity, heat capacity, emissivity) and physical properties (e.g. thickness) of the workpiece 106, and is also provided with an exemplary set of temperature history values $T_{History}$, the latter being provided as a set of temperature and time datapoints [$T_{Substrate}(t)$, t] as discussed above. In this embodiment, the emissivity value initially supplied to the TAS routine is first obtained empirically, by heating the workpiece and allowing it to cool, and measuring the temperature of the workpiece as it cools. The rate of cooling is analyzed with the TAS routine, and a parametric fit (with emissivity as a parameter) is performed to determine radiative energy loss as a function of temperature, from which the emissivity of the workpiece is obtained. Alternatively, the emissivity of the workpiece may be obtained or predicted in other ways, or may be known in advance. Once the emissivity of the workpiece is obtained, the emissivity is then supplied, along with the other input values (the thermal properties and thickness of the workpiece, and the exemplary temperature history values noted above), to the TAS routine.

In response to such input values, the execution of the TAS routine produces a value representing the final instantaneous device side temperature $T_{Device}$ at the same point in time as the final substrate side temperature data point. The corresponding instantaneous substrate side temperature $T_{Substrate}$ is subtracted from the simultaneous device side temperature $T_{Device}$ to determine a temperature correction $\Delta T$, which is typically negative and is typically on the order of fractions of a degree to several degrees Celsius (for example, if a typical wafer is heated to an intermediate temperature of 800° C. at a ramp rate of 150° C./second, by irradiating only the substrate side of the wafer, the $\Delta T$ value would be approximately −4.7°, meaning the device side would be nearly 5° cooler than the substrate side at the time the substrate side reached the intermediate temperature).

This process is then repeated for a significant number of different permutations of exemplary temperature history input data corresponding to different respective model thermal cycles, to generate different respective $\Delta T$ values. For example, in the present embodiment, permutations of input data with ramp rates (corresponding to increase rates of $T_{Substrate}(t)$ in stored temperature history values) ranging from 50° C./s to 400° C./s, final instantaneous substrate temperatures $T_{Substrate}$ ranging from 600° C. to 1450° C., and wafer thicknesses ranging from 0.5 to 1.0 mm, are used to produce the look-up table, so that a corresponding temperature correction $\Delta T$ may be quickly obtained for any permutation of values in such ranges. Alternatively, other ranges of input data may be substituted.

Thus, in the present embodiment the look-up table stored in the look-up table store 246 has four columns (not shown): a first column for average Ramp Rate, a second column for the final instantaneous substrate side temperature $T_{Substrate}(t_0)$ immediately before the heating flash, a third column for workpiece thickness, and a fourth column for the device side temperature correction $\Delta T$ that is to be added to the final instantaneous substrate side temperature $T_{Substrate}(t_0)$ to yield the corresponding simultaneous device side temperature $T_{DEVICE}(t_0)$. (Alternatively, if desired, a column may be provided for the corresponding simultaneous device side temperature itself, rather than a temperature correction to be added to the substrate side temperature to yield the device side temperature.)

To use the pre-calculated look-up table in operation, therefore, block 612 directs the processor circuit 110 to analyze the substrate temperature and time value pairs [$T_{Substrate}(t)$, t] stored in the temperature history store 244, and to calculate an average ramp rate (for example, by setting the average ramp rate equal to the slope of a linear best-fit curve of a plot of $T_{Substrate}(t)$ versus t on the y and x axes, respectively), representing the average rate at which the substrate side 124 of the wafer was raised to the intermediate temperature. Block 612 directs the processor circuit to temporarily store the average ramp rate in the ramp rate register 282. Block 612 then directs the processor circuit to use the average ramp rate stored in the ramp rate register 282, the substrate temperature value $T_{SUBSTRATE}(t_0)$ stored in the substrate temperature register 280, and the thickness of the workpiece, to address the look-up table, to locate a corresponding entry or record having matching values in the first three columns thereof. (The thickness of the workpiece may be a specified parameter of the temperature monitoring and control routine 226, or alternatively, may be specified by a user of the system 100 and stored in a separate register, not shown, in the memory device 260, if desired). Upon locating such a matching record, block 612 directs the processor circuit 110 to read the corresponding temperature correction value $\Delta T$ from the fourth column of the located record. Block 612 directs the processor circuit to add the located $\Delta T$ value (which in this embodiment is typically negative) to the final substrate side temperature $T_{SUBSTRATE}(t_0)$ stored in the substrate temperature register 280, to yield the corresponding simultaneous instantaneous device side temperature $T_{DEVICE}(t_0)$. The processor circuit is directed to store this value in the device side temperature register 284.

Block 614 then directs the processor circuit 110 to transmit the instantaneous device side temperature $T_{DEVICE}(t_0)$ to the ultra-fast radiometer 400. Block 614 also directs the processor circuit 110 to shut down the arc lamp 152 to end the pre-heating cycle, and at the same time, signal the irradiance system 180 to begin producing the irradiance flash to rapidly heat the device side 122 of the wafer 120 to the desired annealing temperature.

(As an alternative, if desired, the processor circuit may be directed control the irradiance system 180 to begin supplying a low current to the flash lamp 182 a fraction of a second before the intermediate temperature is reached, to prepare the flash lamp for the flash. However, such an approach will tend to reduce the magnitude of the $\Delta T$ values stored in the look-up table as compared to single-side irradiance pre-heating, and accordingly, the look-up table values should be adjusted to accommodate this alternative approach.)

The temperature monitoring and control routine 226 is then effectively ended, with subsequent device side temperature monitoring and flash intensity being controlled by the ultra-fast radiometer 400 under the direction of the real-time device side temperature routine 420, as discussed below. However, in this embodiment, the continuous receiving and storage of substrate temperature values by the processor circuit 110 under the direction of block 606 above is continued for a pre-defined time thereafter, to produce and store continuing substrate temperature values during and following the flash cycle, as the wafer cools.

Hemispherical Reflectivity Routine

Figure 7:
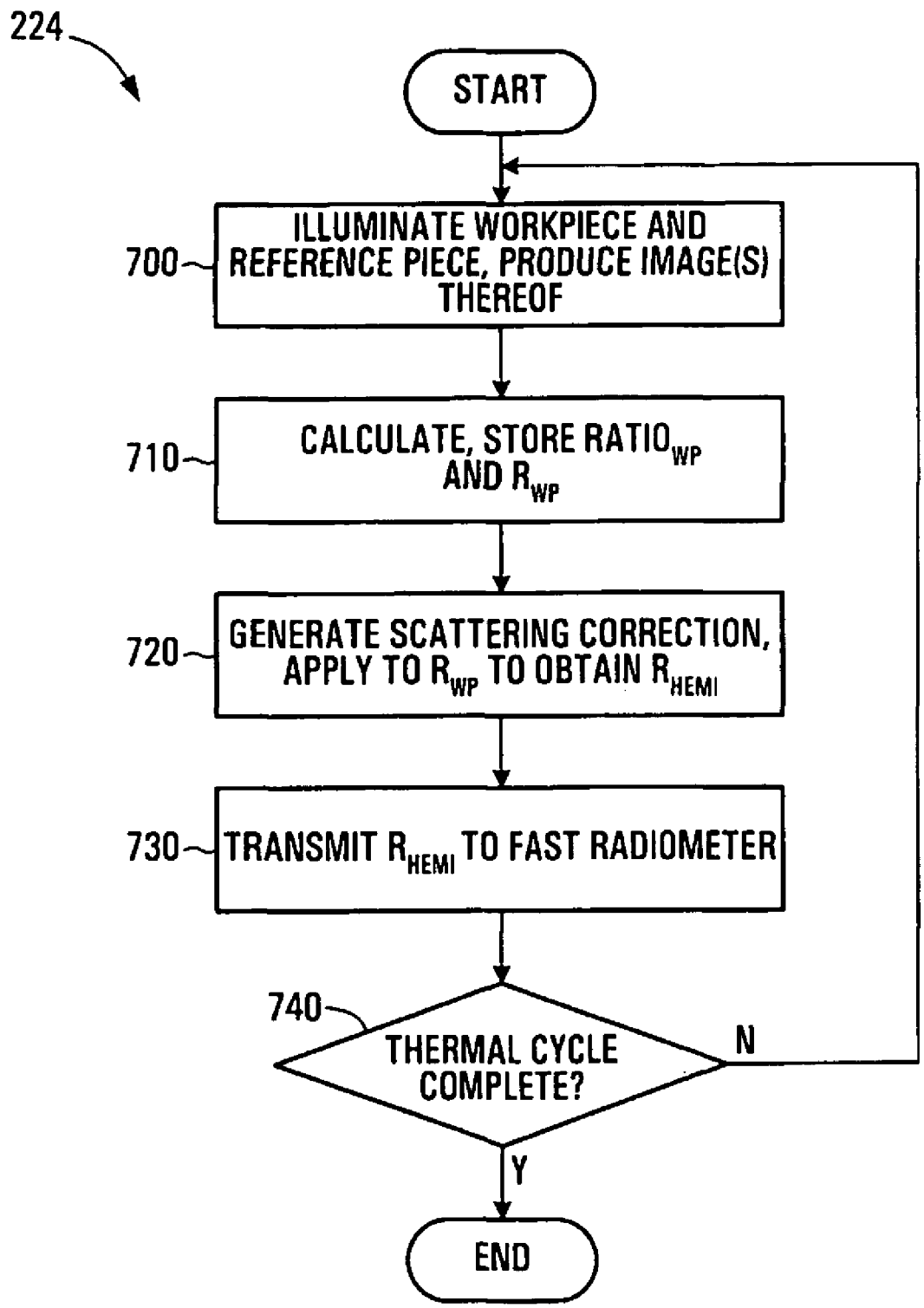
FIG. 7 is a flow chart of a hemispherical reflectivity routine executed by the processor circuit shown in FIG. 2.

Referring to FIGS. 1, 2 and 7, the hemispherical reflectivity routine is shown at 224 in FIG. 7. Generally, the hemispherical reflectivity routine 224 configures the processor circuit 110 of the RSC 112 to cooperate with the measurement device 117, or more particularly with the diagnostic illumination source 160, to measure the hemispherical reflectivity of the second surface 118 of the workpiece 106. Such hemispherical reflectivity values are then effectively communicated to the fast radiometer 164, which uses these values to produce emissivity-compensated temperature measurements of the substrate side 124 of the wafer 120.

The initial steps of the hemispherical reflectivity routine are somewhat similar to those discussed above in connection with the standard ratio routine 222 shown in FIG. 5. However, prior to execution of the hemispherical reflectivity routine, the standard discussed above in connection with the standard ratio routine is removed from the chamber 130, and is replaced with the semiconductor wafer 120. With the wafer in place, the temperature monitoring and control routine 226 shown in FIG. 6 is executed, resulting in the execution of the hemispherical reflectivity routine commencing at block 604 above, once the wafer has reached a sufficiently high temperature to be opaque to radiation at the 1450 nm diagnostic wavelength.

In this embodiment, the hemispherical reflectivity routine 224 begins with a first block 700 of codes, which directs the processor circuit 110 to effectively obtain an image of the substrate side 124 of the wafer 120 and of the reference piece 142, while the wafer and reference piece are being illuminated with the diagnostic illumination source 160, in a manner similar to that discussed above in connection with block 500 of the standard ratio routine. However, as the wafer is now hot, in excess of about 700° C., the image captured by the imaging device 162 during the diagnostic illumination flash will include not only reflected radiation produced by the diagnostic illumination source, but also radiation thermally emitted by the wafer and the reference piece. Accordingly, for the purpose of measuring the hemispherical reflectivity of the workpiece, it is desirable to be able to disregard the effect of such thermal emissions. This may be achieved in a number of ways. For example, the diagnostic illumination source may produce a sufficiently powerful diagnostic flash that thermal emissions from the workpiece are negligible in comparison to the reflected flash. In the present embodiment, however, block 700 directs the processor circuit to signal the synchronization module 202 to effectively obtain a set of three images of the workpiece and reference piece. The first image is captured immediately before a diagnostic illumination flash is commenced, the second image is captured while the diagnostic illumination flash is illuminating the wafer 120 and the reference piece 142 with maximum intensity, and the third image is captured immediately after the diagnostic illumination flash has ceased. Thus, the first image and the third image are effectively thermal emission intensity images, and the second image represents thermal emission intensity plus the intensity of the reflected diagnostic illumination flash. Once a set of three such images has been received by the processor circuit 110 via the digital frame grabber card 200, for each of the photodiodes in the photodiode array of the imaging device, the processor circuit is directed to calculate an average of the data values for that photodiode in the first and third images, which were captured while the diagnostic illumination source was off. This average value represents the approximate intensity of thermal radiation that the corresponding location of the wafer (or the reference piece, as the case may be) thermally emitted at the time the second image was captured. Therefore, this average value is subtracted from the intensity value for that photodiode in the second image, to yield a corrected reflectivity image of the wafer 120 and the reference piece 142 representing only the reflected intensity of the diagnostic illumination flash, without any thermal emission component. The corrected reflectivity image is then stored in the image frames store 242.

Block 710 then directs the processor circuit 110 to calculate a ratio in a manner similar to that discussed in connection with block 510 of the standard ratio routine. In this regard, it will be recalled that the intensity of the diagnostic flash incident upon the reference piece is $I_0$, and therefore, the intensity of the diagnostic flash incident upon the workpiece 106 is $\alpha I_0$, where $\alpha$ is the same constant referred to in connection with block 510, and is determined by the geometry of the system 100. Thus, the reference piece 142 reflects the diagnostic flash with an intensity $I_0 R_{REF}$, where $R_{REF}$ is the reflectivity of the reference piece, and likewise, the workpiece 106, which in this case is the wafer 120, reflects the diagnostic flash with intensity $\alpha I_0 R_{WAF}$. The data values of the corrected reflectivity image produced by the imaging device 162, or more particularly, by individual photodiodes of the InGaAs photodiode array corresponding to the central region 170 of the workpiece 106 and by photodiodes corresponding to the reference piece 142, are used to calculate and store a ratio of the intensity reflected by the workpiece (in this case, the wafer) to the intensity reflected by the reference piece, namely, $RATIO_{WAF} = \alpha I_0 R_{WAF} / I_0 R_{REF} = \alpha R_{WAF} / R_{REF}$. The resulting ratio value is then stored in the workpiece ratio register 270.

Block 710 then directs the processor circuit to identify the directional reflectivity $R_{WAF}$ of the wafer 120. In this regard, as $Ratio_{WAF}/Ratio_{STD} = R_{WAF}/R_{STD}$, the directional reflectivity $R_{WAF}$ of the wafer is then solved from the stored ratios (i.e., the contents $RATIO_{STD}$ and $RATIO_{WAF}$ of the standard ratio register 266 and the workpiece ratio register 270 respectively) and the known reflectivity of the standard (i.e., the contents of the standard reflectivity store 264), namely, $R_{WAF} = Ratio_{WAF} R_{STD}/Ratio_{STD}$. Block 710 directs the processor circuit 110 to store the directional reflectivity $R_{WAF}$ of the workpiece in the directional reflectivity register 272.

Block 720 then directs the processor circuit 110 to generate a scattering correction, and to apply the scattering correction to the directional reflectivity $R_{WAF}$ to obtain the hemispherical reflectivity of the substrate side 124 of the wafer 120.

In this regard, the scattering correction may be determined or pre-determined from the geometry of the system 100 and the nature of the substrate side 124 of the wafer 120. Due to the fact that the substrate side 124 is typically not a perfect specular reflector, radiation incident on the substrate side at angle $\theta$ will not be perfectly reflected at angle $\theta$, but rather, will be reflected over an angle $\theta \pm \Delta\theta$, where $\Delta\theta$ is the difference between specular and actual reflection.

In this embodiment, the primary region of interest of the substrate side 124 is the central region 170, which will be mapped onto a set $\Gamma$ of diodes of the imaging device 162. However, due to scattering, the reflected diagnostic flash from the central region 170 will typically be mapped onto a somewhat larger set $\Pi$ of diodes, corresponding to a larger surrounding central region 172 of the wafer 120. For each of the diodes $\Pi$ corresponding to this larger surrounding central region 172, a unique $\Delta\theta$ is calculated, from the known geometry of the system 100, including the relative angles of the diagnostic illumination source 160 and the imaging device 162. Such $\Delta\theta$ values for each of these diodes may be obtained by applying standard scattering theories.

For example, where an illuminated image of the substrate side 124 of the wafer 120 has been obtained using the diagnostic illumination source 160 and the imaging device 162 (such as the corrected reflectivity image as described in connection with block 700 above, for example), the $\Delta\theta$ value for the $i^{th}$ one of the diodes $\Pi$ may be calculated as follows:

$$\Delta\theta_i = \arctan\left(\frac{d_i}{r}\right)$$

where $d_i$ is the distance from the brightest diode in the image to the $i^{th}$ diode, measured in "wafer units" (i.e. the dimensions of the real wafer 120), and r is the distance from the wafer to the effective center of the imaging device 162. In order to calculate $d_i$ correctly, the image dimensions must be calibrated to the correct x and y sizes of the imaged area. Accordingly, such $\Delta\theta$ values may be pre-calculated and stored if desired, or alternatively, may be produced by the processor circuit 110 under the direction of block 720 of the hemispherical reflectivity routine. In either case, in this embodiment, the $\Delta\theta$ values are temporarily stored in the scattering values register 274.

Block 720 directs the processor circuit 110 to generate a scattering correction, in response to the $\Delta\theta$ values and the corrected reflectivity image obtained above at block 700. More particularly, where the corrected reflected intensity data value corresponding to the $i^{th}$ diode is denoted $I_i$, block 720 directs the processor circuit 110 to calculate a scattering correction S, as follows:

$$S = \frac{\sum_{i \in \Pi}\left(\frac{I_i}{\cos^3 \Delta\theta_i}\right)}{\sum_{i \in \Pi} I_i}, S \geq 1$$

The above scattering correction is an empirical correlation for weak scatters. Alternatively, other types of scattering corrections may be substituted. Such alternatives may be particularly desirable if other types of wafers or workpieces are substituted for the wafer 120.

The scattering correction S is then stored in the scattering correction register 276. Block 720 further directs the processor circuit 110 to apply the scattering correction to the directional reflectance $R_{WAF}$ to obtain the hemispherical reflectance $R_H$ of the substrate side 124 of the wafer 120, as $R_H = S R_{WAF}$. Block 720 directs the processor circuit 110 to store the hemispherical reflectivity $R_H$ in the hemispherical reflectivity register 278.

Block 730 then directs the processor circuit 110 to transmit the hemispherical reflectivity value $R_H$ to the fast radiometer 164, for use in producing emissivity-compensated temperature measurements of the substrate side 124 of the wafer 120, as discussed below in connection with the substrate temperature routine 318. However, despite the relatively fast sampling rate of the fast radiometer 164, which generates a new substrate temperature value every millisecond, it is not necessary for the hemispherical reflectivity routine 224 to cause the processor circuit 110 to update the hemispherical reflectivity value at such a high rate. In this regard, it will be appreciated that emissivity (and hence reflectivity) varies somewhat weakly with temperature. Accordingly, depending on the required accuracy of the particular application, it may suffice for the interval between successive hemispherical reflectivity values to significantly exceed the interval between successive temperature values produced by the fast radiometer. Thus, for some applications, it may be sufficient to update the hemispherical reflectivity value at a rate of 10 Hz, or even 1 Hz, for example.

Thus, following execution of block 730, block 740 directs the processor circuit 110 to determine whether the thermal cycle has ended, and if not, the processor circuit is directed to wait for an acceptable refreshing interval, such as 100 ms or 1 s, for example, and is then directed back to blocks 700 to 730 to generate a new hemispherical reflectivity value as described above. Such processing continues until the thermal cycle has ended and the wafer has cooled back down to below the threshold temperature (in this embodiment, roughly 700° C.) and thus ceases to be opaque to the 1450 nm diagnostic wavelength.

Substrate Temperature Routine

Figure 8:
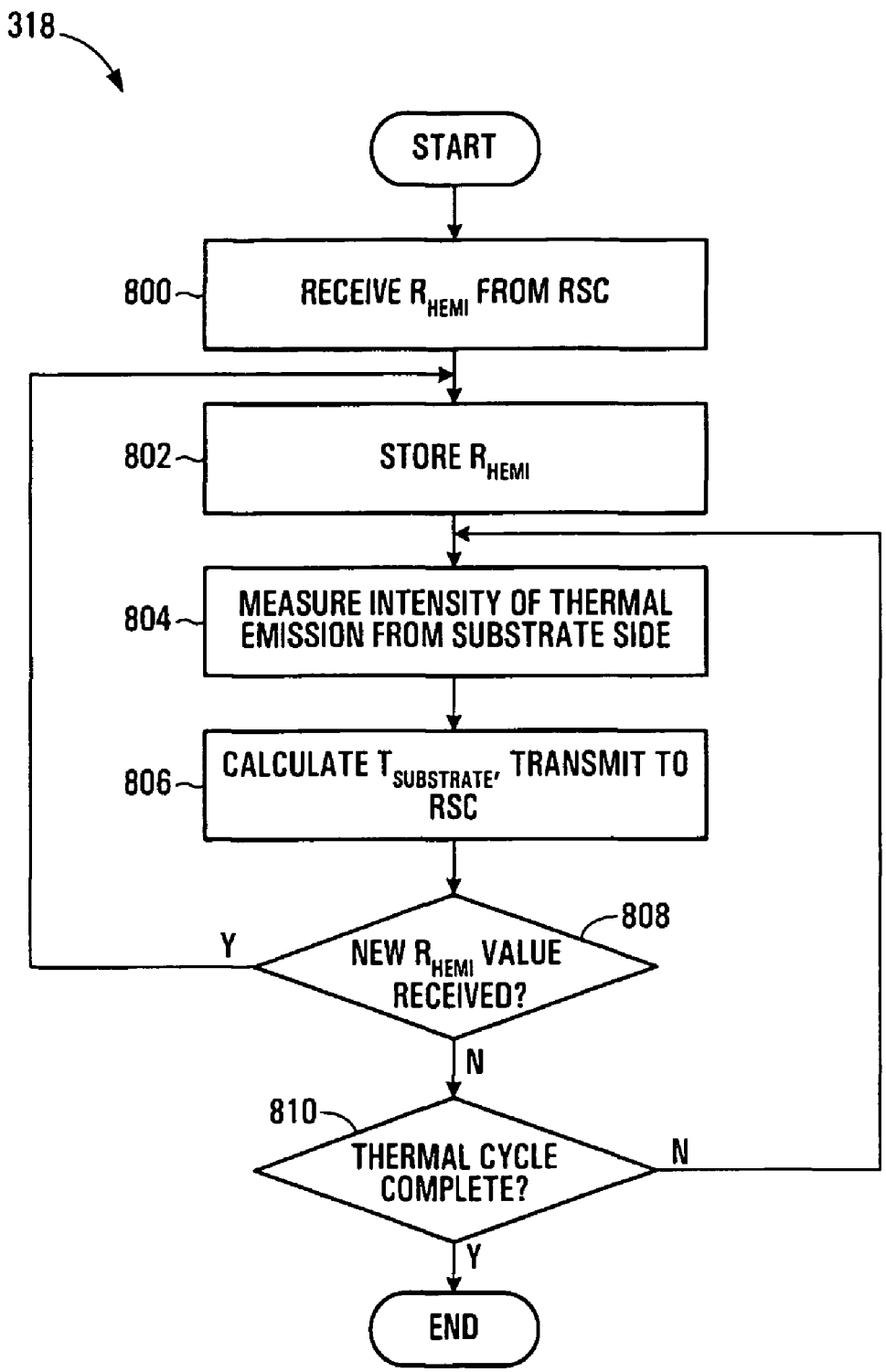
FIG. 8 is a flow chart of a substrate temperature routine executed by a processor circuit of the fast radiometer shown in FIG. 3.

Referring to FIGS. 1, 3 and 8, the substrate temperature routine is shown at 318 in FIG. 8. Generally, the substrate temperature routine 318 configures the processor circuit 114 of the fast radiometer 164 to identify the temperature of the second surface 118 of the workpiece 106. More particularly, the processor circuit 114 is configured to identify the temperature of the second surface 118 in response to the hemispherical reflectivity of the second surface, and radiation thermally emitted by the second surface.

The substrate temperature routine commences with a first block 800 of codes, which directs the processor circuit 114 to await receipt of an initial hemispherical reflectivity value $R_H$ from the processor circuit 110, as discussed above in connection with the hemispherical reflectivity routine.

Following receipt of this initial hemispherical reflectivity value, block 802 directs the processor circuit 114 to store the received $R_H$ value in the hemispherical reflectivity register 320.

Block 804 then directs the processor circuit 114 to measure an intensity of radiation thermally emitted by the substrate side 124 of the wafer 120. More particularly, block 804 directs the processor circuit 114 to measure an intensity $I_{THERMAL}(t)$ of radiation thermally emitted by the central region 170 of the substrate side 124, at the 1450 nm diagnostic wavelength. Unlike the image produced above for scattering purposes, this measurement is synchronized so as to be performed at a time when the substrate side 124 is not being illuminated by a diagnostic flash, and thus, the only radiation detectable by the radiometer 164 is radiation thermally emitted by the hot wafer 120. (It will be recalled that due to the operation of the water-cooled window 156, the irradiance produced by the pre-heating device 150 does not include wavelengths at the diagnostic wavelength, and thus, even if the pre-heating device 150 is actively irradiating the wafer 120, any reflections of such irradiance will not be detected by the radiometer 164.) To achieve this, the processor circuit 114 is directed to monitor signals received from the A/D converter 310, representing 20-bit samples of the amplified output of the photodiode 306, unless a synchronization signal received from the network 292 indicates that the diagnostic illumination source 160 is currently flashing, in which case the measurement of such thermally emitted radiation is delayed until the diagnostic illumination source has been switched off.

Block 806 then directs the processor circuit 114 to identify the temperature of the substrate side 124 of the wafer 120, in response to the thermal emission intensity value measured at block 804 and the hemispherical reflectivity value received from the processor circuit 110. More particularly, the measured thermal emission intensity value $I_{THERMAL}(t)$ is used to calculate the instantaneous temperature of the central region 170 of the substrate side 124 of the wafer 120, as follows:

$$T_{Substrate}(t) = \frac{hc}{\lambda k \ln\left(1 + \frac{2\pi c^2 h \Delta_\lambda \varepsilon_H}{I_{thermal} \lambda^5}\right)}$$

where $T_{SUBSTRATE}(t)$=instantaneous temperature of the substrate side 124 at the central region 170 at time t;

$I_{THERMAL}(t)$=measured intensity of radiation thermally emitted by the substrate side 124 at the central region 170 at time t;

$\varepsilon_H$=emissivity of the substrate side 124 in the direction of the diagnostic flash, equal to $\kappa(1-R_H)$ where:

$R_H$ is the hemispherical reflectivity of the substrate side, as discussed above (it will be recalled that the wafer is opaque to the diagnostic wavelength at all temperatures at which this routine is executed, and hence transmissivity is zero and may be ignored in obtaining emissivity from the hemispherical reflectivity value); and $\kappa$ is a system constant accounting for the differences in the chamber return between the fast radiometer and the imaging device. For an ideal system $\kappa=1$, although in the present embodiment, wherein the workpiece includes a 300 mm diameter polished silicon wafer, and the measurement devices are those described herein, $\kappa \cong 0.9$.

$\lambda$=diagnostic wavelength at which $I_{THERMAL}(t)$ was measured (in this embodiment, $\lambda=1450$ nm);

$\Delta_\lambda$=bandpass of the fast radiometer 164 (in this embodiment, $\pm 15$ nm); and c,h,k,e=speed of light, Planck's constant, Boltzmann's constant, Euler's number, respectively.

Block 806 then directs the processor circuit 114 to transmit the substrate side temperature value $T_{SUBSTRATE}(t)$ to the processor circuit 110 of the RSC 112, for storage in the temperature history store 244 as discussed earlier herein.

Block 808 then directs the processor circuit 114 to determine whether a new hemispherical reflectivity value has been received from the processor circuit 110 via the network 292, and if so, the processor circuit is directed back to block 802 to store the new reflectivity value in the hemispherical reflectivity register 320 and continue obtaining substrate temperature values using the newly-received reflectivity value. If no new reflectivity value has been received, block 810 directs the processor circuit 114 to determine whether the thermal cycle has ended, and if not, the processor circuit is directed back to block 804 to continue obtaining substrate temperature values using the previously-received and stored hemispherical reflectivity value. Irrespective of whether or not a new hemispherical reflectivity value has been received at block 808, in this embodiment block 806 is re-executed by the processor circuit 114 once every millisecond, to obtain and transmit a new substrate temperature value. Thus, the processor circuit 114 is configured to repeatedly identify successive values of the temperature of the second surface 118 of the workpiece 106 at successive respective times, and to transmit such values to the processor circuit 110 which stores these values to generate the temperature history of the workpiece. Such substrate temperature measurement continues until after the thermal processing cycle (including the pre-heating cycle, the flash cycle and the subsequent cooling stage) has ended, and the wafer has cooled to a sufficiently cold temperature that it is no longer opaque to the 1450 nm diagnostic wavelength.

Real-Time Device Side Temperature Monitoring and Control Routine

Figure 9:
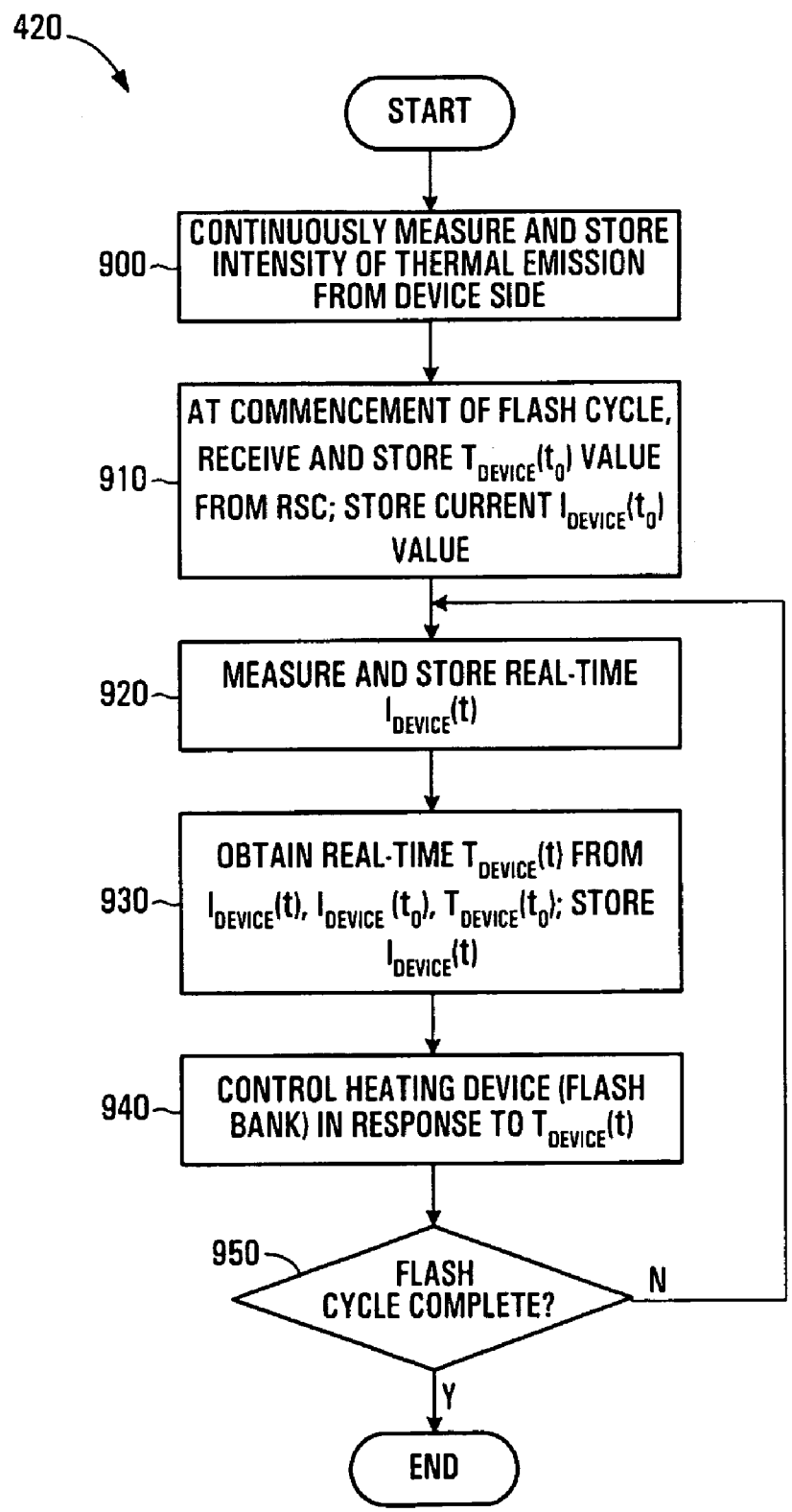
FIG. 9 is a flow chart of a real-time device side temperature routine executed by a processor circuit of the ultra-fast radiometer shown in FIG. 4.

Referring to FIGS. 1, 4 and 9, the real-time device side temperature routine is shown at 420 in FIG. 9. Generally, this routine configures the processor circuit 108 of the ultra-fast radiometer 400 to identify a present temperature (in this embodiment, $T_{DEVICE}(t)$) of the first surface 104 of the workpiece 106, in response to the present intensity of radiation thermally emitted from the first surface 104 and at least one previous thermal property of the first surface at a respective previous time. More particularly, in this embodiment the at least one previous thermal property includes a previous temperature of the first surface 104, and a previous intensity of radiation thermally emitted from the first surface at the time the first surface was at the previous temperature. More particularly still, in the present embodiment, the at least one previous thermal property includes the previous temperature $T_{DEVICE}(t_o)$ of the device side 122 of the wafer 120 immediately prior to the commencement of the irradiance flash, and the corresponding previous intensity $I_{DEVICE}(t_0)$ of thermal emission from the device side immediately prior to the commencement of the irradiance flash.

In the present embodiment, the processor circuit 108 is directed to identify such present temperature values $T_{DEVICE}(t)$ during the irradiance flash, at a rate which is fast compared to the duration of the flash. Thus, in the present embodiment, as the A/D converter 412 samples the amplified signal from the photodiode 406 at a rate of 1 MHz, up to 1000 successive temperature values can be produced during the course of a one-millisecond flash, for example, each successive temperature value representing the temperature of the device side at the next successive one-microsecond interval during the flash. Such real-time temperature values may be used for feedback control of the flash itself, if desired. Alternatively, even if these real-time temperature values are not used for feedback control of the flash, they may be useful for analysis after the flash is complete, to enable a user of the system to detect any significant inconsistencies in wafer processing.

The real-time device side temperature routine 420 begins with a first block 900 of codes, which directs the processor circuit 108 to continuously measure and store thermal intensity values $I_{DEVICE}(t)$, representing the intensity of radiation thermally emitted by the central region 170 of the device side 122 of the wafer 12, at successive instants in time. Again, in the present embodiment, as the A/D converter samples the amplified signal from the photodiode 406 at 1 MHz, up to a million such values can be stored every second, if desired. The processor circuit 108 is directed to store such thermal intensity values and their corresponding times, in the device side thermal emission intensity store 430.

Block 910 directs the processor circuit 108 to receive, from the processor circuit 110 of the RSC 112, an initial device-side temperature value $T_{DEVICE}(t_0)$, and to store the received value in the initial device-side temperature register 432. Referring back to FIG. 6, it will be recalled that this value $T_{DEVICE}(t_0)$ represents the device side temperature immediately before the commencement of the heating flash produced by the irradiance system, and is transmitted to the processor circuit 108 approximately simultaneously with the commencement of the flash cycle. Upon receiving and storing the initial device-side temperature value $T_{DEVICE}(t_0)$, block 910 also directs the processor circuit 108 to store a corresponding simultaneous device-side thermal emission intensity value $I_{DEVICE}(t_0)$ in the initial device-side thermal intensity register 434.

Thus, approximately simultaneously with the storage of these initial temperature and intensity values by the processor circuit 108, the irradiance system commences the flash cycle, exposing the device side 122 of the wafer 120 to a high-energy flash having a duration on the order of one millisecond, thereby rapidly heating the device side 122 of the wafer at a much fast rate than a rate of thermal conduction in the wafer, so that only a shallow layer in the vicinity of the device side 122 is heated to the final annealing temperature, while the bulk of the wafer 120 remains close to the intermediate temperature.

Blocks 920 and 930 then direct the processor circuit 108 to measure the temperature of the device-side 124 at the next successive instant (in this embodiment, the next successive one-microsecond interval) during the flash cycle.

To achieve this, block 920 directs the processor circuit 108 to measure and store a real-time intensity value $I_{DEVICE}(t)$, representing the intensity of radiation thermally emitted by the central region 170 of the device side 122 of the wafer 120. To achieve this, the processor circuit 108 receives, from the A/D converter 412, a 16-bit sample of the amplified signal from the photodiode 406, and stores it in the device side thermal emission intensity store 430 as described above. (If applicable, the concurrently-running dynamic calibration routine 422 may direct the processor circuit 108 to adjust the received sample value prior to storage, based on the signals received from the internal reference device 450).

Block 930 then directs the processor circuit 108 to identify the present real-time temperature of the central region 170 of the device side 122, in response to the previous thermal properties of the device side. More particularly, block 930 directs the processor circuit 108 to calculate the present real-time device side temperature as follows:

$$T_{DEVICE}(t) = \frac{hc}{\lambda k \ln\left[\frac{I_{DEVICE}(t_0)}{I_{DEVICE}(t)}(e^{hc/\lambda k T_{DEVICE}(t_0)} - 1)\right]}$$

where
$T_{DEVICE}(t)$=real-time temperature of the device side 122 at the central region 170 of the workpiece;
$I_{Device}(t)$=real-time measurement value produced by the ultra-fast radiometer 400 of the thermal emission intensity from the device side 122 at the central region 170 of the workpiece;
$T_{DEVICE}(t_0)$=instantaneous temperature of the device side 122 at the central region 170, immediately prior to commencement of the heating flash produced by the irradiance system 180;
$I_{DEVICE}(t_0)$=instantaneous intensity of thermal emission from the device side 122 at the central region 170, immediately prior to commencement of the heating flash; and
the remaining variables and constants are as defined above.

In the foregoing calculation at block 930, it is assumed that the emissivity of the device side 122 remains constant during the flash cycle. Although this assumption is not entirely accurate, the emissivity of similar wafers will vary similarly when subjected to similar thermal cycles. Thus, even if the assumption of constant emissivity introduces a slight measurement error into the device-side temperature measurements in the vicinity of the peak annealing temperature, such errors will be consistently reproduced for similar wafers in similar cycles. Thus, any such errors will not affect the reproducibility of the resulting thermal cycle.

In this embodiment, the execution of blocks 920 and 930 is repeated a significant number of times during the course of the irradiance flash produced by the irradiance system 180. More particularly, in this embodiment the irradiance flash has a duration on the order of one millisecond, and blocks 920 and 930 are repeated once every microsecond, thereby producing 1000 successive real-time device-side temperature values during the course of the one-millisecond flash cycle. Thus, in the present embodiment, the real-time device side temperature routine configures the processor circuit 108 to repeatedly identify successive values of the present temperature of the first surface 104 in response to successive respective values of the present intensity of radiation thermally emitted by the first surface, while the first surface is being irradiated, or more particularly, while the first surface is being exposed to an irradiance flash having a duration less than a thermal conduction time of the workpiece.

If desired, the real-time device side temperature routine 420 may include instruction codes for directing the processor circuit 108 of the ultra-fast radiometer 400 to control the power of the irradiance flash produced by the irradiance system, in response to the real-time temperature values.

For example, in the present embodiment, the real-time device side temperature routine 420 includes a further block 940 of codes, which directs the processor circuit 108 to control power supplied to the irradiance system 180 to control the power of the irradiance flash. More particularly, in this embodiment block 940 directs the processor circuit 108 to determine whether at least one pre-defined condition is satisfied. More particularly still, block 940 directs the processor circuit 108 to determine whether the most-recently obtained real-time device side temperature value $T_{DEVICE}(t)$ is greater than or equal to a pre-defined maximum desired temperature of the device side 122 during the course of the flash. If so, block 940 directs the processor circuit 108 to signal the power control system 188 of the irradiance system 180, to immediately discontinue the remainder of the pulsed discharge of electrical power from the power control system to the flash lamp 182.

Figure 10:
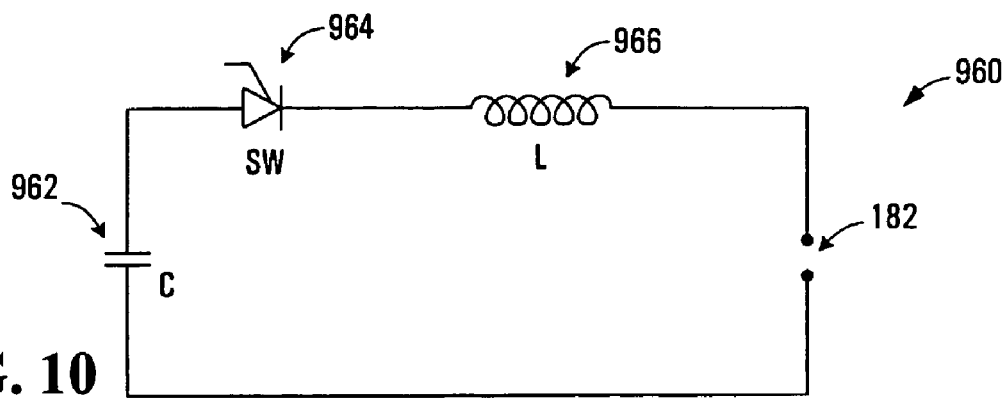
FIG. 10 is a circuit diagram of a flash lamp power control circuit controlled by the processor circuit shown in FIG. 4.

For example, referring to FIG. 10, a power control circuit of the power control system 188 according to one embodiment of the invention is shown generally at 960. The stored charge that is to be supplied to the flash lamp 182 to produce the irradiance flash is stored in a large capacitor bank, which for ease of illustration is symbolized by a single capacitor 962 in FIG. 10. A switch 964 and an inductor 966 are interposed in series between one plate of the capacitor and one electrode of the flash lamp 182, and the other electrode of the flash lamp is connected to the other plate of the capacitor. In embodiments where closed-loop feedback control of the flash is not required, the switch 964 need not be easily restored from its conducting state to its open or non-conducting state. Thus, in such embodiments, a silicon controlled rectifier having a holding current less than the expected current discharge during the flash, may be employed as the switch 964. Alternatively, however, if feedback control is desired with such a circuit, the switch 964 preferably includes a switch type that is easily restored from its conducting state to its non-conducting state while it is in the process of conducting the large expected discharge current from the capacitor 962. In such an embodiment, if at block 940 the processor circuit 108 determines that the device side temperature $T_{DEVICE}(t)$ is greater than or equal to the pre-defined maximum desired temperature, the processor circuit 108 is directed to open the switch 964 to discontinue the electrical discharge from the capacitor 962.

Similarly, if desired, block 940 may direct the processor circuit 108 to periodically compare a real-time device side temperature value $T_{DEVICE}(t)$ with an expected or predicted device side temperature for the same time t during the course of the flash cycle, and may increase or decrease the power supplied by the power control system 188 to the flash lamp 182 so as to minimize any discrepancies between actual and expected device side temperature.

Figure 11:
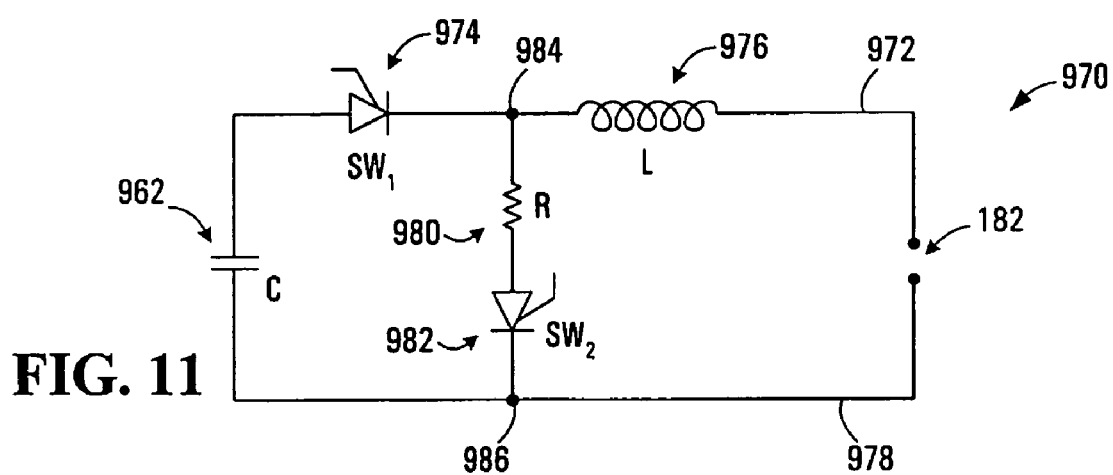
FIG. 11 is a circuit diagram of a flash lamp power control circuit controlled by the processor circuit shown in FIG. 4, according to a second embodiment of the invention.

For example, referring to FIG. 11, a power control circuit of the power control system 188 according to a second embodiment of the invention is shown generally at 970. The capacitor bank that is to be discharged to produce the irradiance flash is again symbolically shown as a single capacitor 962, for ease of illustration. Along a first electrical pathway 972 connecting one plate of the capacitor 962 to one electrode of the flash lamp, a switch 974 and an inductor 976 are interposed in series. A second electrical pathway 978 connects the other plate of the capacitor to the other electrode of the flash lamp. A resistor 980 and a second switch 982 in series, are connected between the first electrical pathway 972 and the second electrical pathway 978, with the resistor being connected to the first electrical pathway 972 at a point 984 between the first switch 974 and the inductor 976, and the second switch 986 being connected to the second electrical pathway 978 at a point 986. The second switch 982 may include a gate-controlled switch, such as a silicon controlled rectifier, for example. More generally, any suitable switch types may be used as the switches 974 and 982. When the first switch 974 is initially closed by the processor circuit 110 of the RSC 112 to initiate the flash, the second switch 982 is left open. If at block 940 the processor circuit 108 of the ultra-fast radiometer 400 determines that the device side temperature $T_{DEVICE}(t)$ is higher than a desired temperature at a given point in time during the flash, block 940 directs the processor circuit 108 to apply a gate signal to the gate of the second switch 982 to close the second switch and cause some of the electrical current discharged by the capacitor 962 to flow through the resistor 980, thereby reducing the current supplied by the capacitor 962 to the flash lamp 182.

Figure 12:
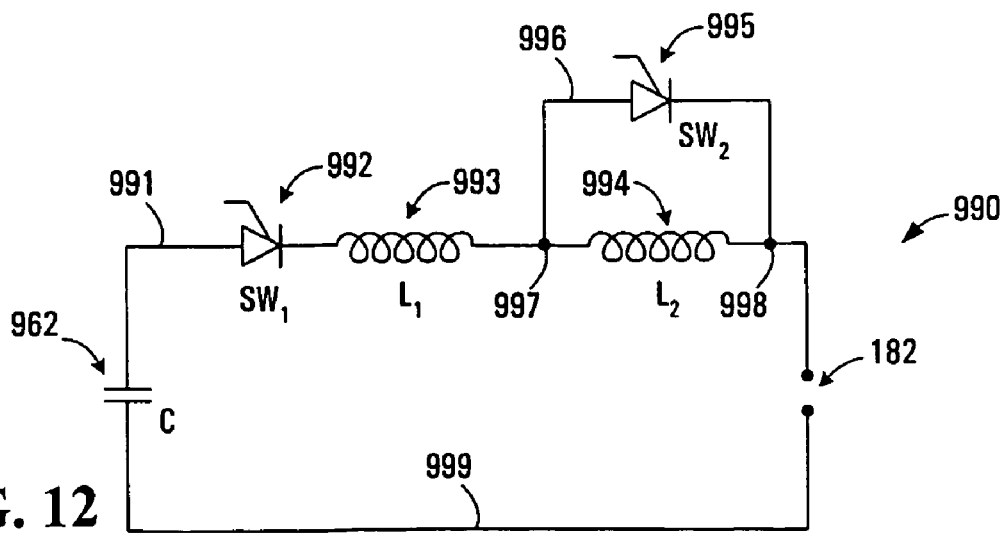
FIG. 12 is a circuit diagram of a flash lamp power control circuit controlled by the processor circuit shown in FIG. 4, according to a third embodiment of the invention.

Similarly, referring to FIG. 12, a power control circuit of the power control system 188 according to a third embodiment of the invention is shown generally at 990. The capacitor bank that is to be discharged to produce the irradiance flash is again symbolically shown as a single capacitor 962, for ease of illustration. Along a first electrical pathway 991 connecting a first plate of the capacitor 962 to a first electrode of the flash lamp 182, a first switch 992, a first inductor 993, and a second inductor 994 in parallel with a second switch 995, are interposed in series. In this regard, the second switch 995 is interposed along an electrical sub-pathway 996 of the first electrical pathway 991. One end of the electrical sub-pathway 996 is connected to a point 997 interposed between the first inductor 993 and the second inductor 994. The other end of the electrical sub-pathway 996 is connected to a point 998 interposed between the second inductor 994 and the first plate of the flash lamp 182. The second switch 995 may include a gate-controlled switch, such as a silicon controlled rectifier, for example. More generally, any suitable switch types may be used as the switches 992 and 995. A second electrical pathway 999 connects the second plate of the capacitor 962 to the second electrode of the flash lamp 182. When the first switch 992 is initially closed by the processor circuit 110 of the RSC 112 to initiate the flash, the second switch 995 is left open. If at block 940 the processor circuit 108 of the ultra-fast radiometer 400 determines that the device side temperature $T_{DEVICE}(t)$ is lower than a desired temperature at a given point in time during the flash, block 940 directs the processor circuit 108 to apply a gate signal to the gate of the second switch 995 to close the second switch, thereby increasing the current supplied by the capacitor 962 to the flash lamp 182.

In this embodiment, irrespective of whether a feedback control block 940 is provided, block 950 directs the processor circuit to determine whether the thermal cycle (including the pre-heating cycle, the flash cycle, and the subsequent cooling stage) has ended, and the wafer has cooled to a sufficiently cold temperature that it is no longer opaque to the 1450 nm diagnostic wavelength. If the thermal cycle has not ended, the processor circuit is directed back to blocks 920 and 930, which are repeatedly re-executed by the processor circuit 108, to continue repeatedly identifying the real-time device-side temperature at 1 μs intervals during the irradiance flash and the cooling stage thereafter.

Further Exemplary Alternatives

Figure 13:
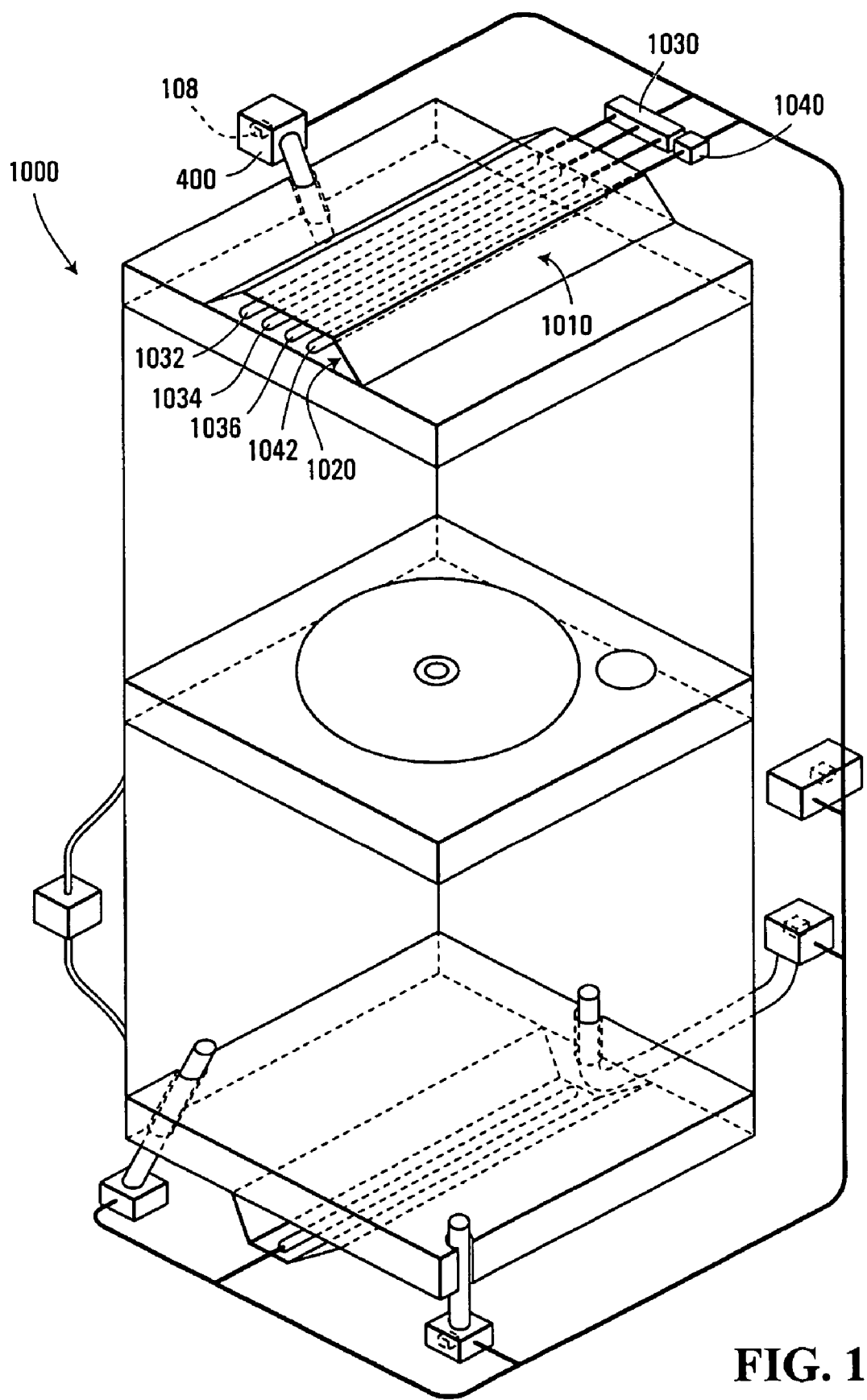
FIG. 13 is a perspective view of a system for temperature measurement and for heat-treating a workpiece, according to a fourth embodiment of the invention, shown with two vertical front-side walls removed.

Referring to FIGS. 1, 4, 6, 9 and 13, a system for temperature measurement and for heat-treating a workpiece according to a fourth embodiment of the invention is shown generally at 1000 in FIG. 13. The system 1000 is generally similar to the system 100 shown in FIG. 1, except that an alternative irradiance system 1010 has been substituted for the irradiance system 180.

In this embodiment, the irradiance system 1010 includes a plurality of irradiance sources shown generally at 1020, or more particularly, a plurality of arc lamps similar to the flash lamp 182 shown in FIG. 1. The at least one processor circuit (or more particularly, the processor circuit 108 of the ultra-fast radiometer 400) is configured to activate one of the plurality of irradiance sources only if the present temperature of the first surface is less than a pre-defined threshold.

More particularly, in this embodiment, the irradiance system 1010 includes at least two independent power control systems 1030 and 1040, each of which is similar to the pulsed discharge power supply unit of the power control system 188 shown in FIG. 1. The first power control system 1030 supplies power to first, second and third arc lamps 1032, 1034 and 1036, while the second power control system 1040 supplies power to a fourth arc lamp 1042. In this embodiment, the first power control system 1030 is activated under the direction of the processor circuit 110 of the RSC 112, as discussed above in connection with block 616 of the temperature monitoring and control routine 226 shown in FIG. 6.

However, in the present embodiment, the second power control system 1040 is not controlled by the RSC 112. Rather, in this embodiment, the second power control system 1040 is activated by the processor circuit 108 of the ultra-fast radiometer 400 under the direction of block 940 of the real-time device side temperature routine 420 shown in FIG. 9. More particularly, in this embodiment, block 940 directs the processor circuit 108 to activate the second power control system 1040 only if, after a pre-defined interval following the commencement of the flash cycle, the present device side temperature $T_{DEVICE}(t)$ is less than a pre-defined desired temperature. Thus, in this embodiment, the energy discharged to the fourth arc lamp will be adjusted to cause the device side 122 of the wafer to reach the desired temperature.

Alternatively, if desired, the number of flash lamps or other suitable irradiance sources that are under the control of the processor circuit 108 may be varied, if desired.

More generally, while specific embodiments of the invention have been described and illustrated, such embodiments should be considered illustrative of the invention only and not as limiting the invention as construed in accordance with the accompanying claims.

What is claimed is:

1. A temperature measurement method comprising:
   a) measuring a present intensity of radiation thermally emitted from a first surface of a workpiece, wherein the workpiece comprises a semiconductor wafer and the first surface comprises a device side of the wafer; and
   b) identifying a present temperature of the first surface, in response to the present intensity, a previous temperature of the first surface at a respective previous time and a previous intensity of radiation thermally emitted from the first surface at the previous time, wherein identifying comprises identifying the present temperature of the device side while the device side is being exposed to an irradiance flash having a duration less than a thermal conduction time of the wafer.

2. The method of claim 1 wherein the irradiance flash has a duration less than 10 milliseconds.

3. The method of claim 1 further comprising identifying, at the previous time, the previous temperature of the first surface and the previous intensity of radiation thermally emitted from the first surface, wherein the previous temperature comprises a previous temperature of the device side of the wafer immediately preceding commencement of the irradiance flash.

4. The method of claim 3 wherein the previous intensity comprises a previous intensity of radiation thermally emitted from the device side immediately preceding commencement of the irradiance flash.

5. The method of claim 1 wherein measuring comprises measuring the present intensity in a wavelength band in which an irradiance spectrum incident upon the first surface has negligible intensity.

6. The method of claim 5 further comprising removing the wavelength band from the irradiance spectrum incident upon the first surface.

7. The method of claim 1 further comprising repeatedly identifying successive values of the present temperature of the first surface in response to successive respective values of the present intensity of radiation thermally emitted by the first surface.

8. The method of claim 7 wherein repeatedly identifying comprises repeatedly identifying the successive values of the present temperature of the first surface while the first surface is being irradiated.

9. The method of claim 7 wherein repeatedly identifying comprises repeatedly identifying the successive values of the present temperature of the first surface while the first surface is being exposed to the irradiance flash.

10. The method of claim 1 further comprising identifying, at the previous time, the previous temperature of the first surface.

11. The method of claim 10 wherein identifying the previous temperature of the first surface comprises identifying the previous temperature in response to a previous temperature of a second surface of the workpiece unequal to the previous temperature of the first surface.

12. The method of claim 11 wherein identifying the previous temperature of the first surface comprises identifying the previous temperature of the first surface in response to the previous temperature of the second surface and a temperature history of the workpiece.

13. The method of claim 12 wherein the second comprises a substrate side of the wafer.

14. The method of claim 12 wherein identifying the previous temperature of the first surface comprises using the previous temperature of the second surface and the temperature history to address a look-up table record.

15. The method of claim 12 further comprising identifying, at the previous time, the previous temperature of the second surface.

16. The method of claim 15 further comprising repeatedly identifying and storing successive values of the previous temperature of the second surface at successive respective times, to generate the temperature history of the workpiece.

17. The method of claim 15 wherein identifying the previous temperature of the second surface comprises identifying the previous temperature of the second surface in response to a hemispherical reflectivity of the second surface.

18. The method of claim 17 further comprising measuring the hemispherical reflectivity.

19. The method of claim 18 wherein measuring the hemispherical reflectivity comprises receiving radiation reflected by the second surface at a detector positioned sufficiently far away from the second surface to avoid obstructing the second surface from fields of view of other devices of a system in which the workpiece is located.

20. The method of claim 18 wherein measuring the hemispherical reflectivity comprises receiving radiation reflected by the second surface at a detector positioned a distance from a center of the second surface, the distance being at least as great as one-half of the largest dimension of the workpiece.

21. The method of claim 18 wherein identifying the previous temperature of the second surface comprises identifying the previous temperature of the second surface in response to the hemispherical reflectivity of the second surface and radiation thermally emitted by the second surface.

22. The method of claim 18 wherein measuring the hemispherical reflectivity comprises measuring a directional reflectivity of the second surface.

23. The method of claim 22 wherein measuring the hemispherical reflectivity further comprises applying a scattering correction to the directional reflectivity to obtain the hemispherical reflectivity.

24. The method of claim 23 further comprising generating the Scattering correction.

25. The method of claim 22 wherein measuring the directional reflectivity comprises measuring reflected intensity in an illumination wavelength band in which a heating irradiance spectrum incident upon the second surface has negligible intensity.

26. The method of claim 25 further comprising removing the Illumination wavelength band from the heating irradiance spectrum.

27. A temperature measurement system comprising:
   a) a measurement device configured to measure a present intensity of radiation thermally emitted from a first surface of a workpiece, wherein the workpiece comprises a semiconductor wafer and the first surface comprises a device side of the wafer;
   b) at least one processor circuit in communication with the measurement device, the at least one processor circuit configured to identify a present temperature of the first surface, in response to the present intensity, a previous temperature of the first surface at a respective previous time and a previous intensity of radiation thermally emitted from the first surface at the previous time; and
   c) an irradiance system operable to irradiate the device side of the wafer;
   wherein the measurement device and the at least one processor circuit are configured to measure the present intensity and identify the present temperature of the device side while the device side is being irradiated by the irradiance system, wherein the irradiance system is operable to expose the device side to an irradiance flash having a duration less than a thermal conduction time of the wafer, and wherein the measurement device and the at least one processor circuit are configured to measure the present intensity and identify the present temperature during the irradiance flash.

28. The system of claim 27 wherein the irradiance system is operable to produce the irradiance flash to have a duration on the order of 10 milliseconds or less.

29. The system of claim 27 wherein the irradiance system is operable to produce the irradiance flash to have a duration on the order of 1 millisecond.

30. The system of claim 27 wherein the at least one processor circuit is configured to identify, at the previous time, the previous temperature of the first surface and the previous intensity of radiation thermally emitted from the first surface, wherein the previous temperature comprises a previous temperature of the device side of the wafer immediately preceding commencement of the irradiance flash.

31. The system of claim 30 wherein the previous intensity comprises a previous intensity of radiation thermally emitted from the device side immediately preceding commencement of the irradiance flash.

32. The system of claim 27 wherein the measurement device comprises a radiometer.

33. The system of claim 32 wherein the radiometer comprises a high-speed lnGaAs photodiode.

34. The system of claim 27 wherein the measurement device is configured to measure the present intensity in a wavelength band in which an irradiance spectrum incident upon the first surface has negligible intensity.

35. The system of claim 34 further comprising a filtering device configured to remove the wavelength band from the irradiance spectrum incident upon the first surface.

36. The system of claim 35 wherein the filtering device comprises a water-cooled window interposed between the first surface and a source of the irradiance spectrum.

37. The system of claim 27 wherein the at least one processor circuit is configured to repeatedly identify successive values of the present temperature of the first surface in response to successive respective values of the present intensity of radiation thermally emitted by the first surface.

38. The system of claim 37 wherein the at least one processor circuit is configured to repeatedly identify the successive values of the present temperature of the first surface while the first surface is being irradiated.

39. The system of claim 37 wherein the at least one processor circuit is configured to repeatedly identify the successive values of the present temperature of the first surface while the first surface is being exposed to the irradiance flash.

40. The system of claim 27 wherein the at least one processor circuit is configured to identify, at the previous time, the previous temperature of the first surface.

41. The system of claim 40 wherein the at least one processor circuit is configured to identify the previous temperature of the first surface in response to a previous temperature of a second surface of the workpiece unequal to the previous temperature of the first surface.

42. The system of claim 41 wherein the at least one processor circuit is configured to identify the previous temperature of the first surface in response to the previous temperature of the second surface and a temperature history of the workpiece.

43. The system of claim 42 wherein the second surface comprises a substrate side of the wafer.

44. The system of claim 42 wherein the at least one processor circuit is configured to use the previous temperature of the second surface and the temperature history to address a look-up table record, to identify the previous temperature of the first surface.

45. The system of claim 42 wherein the at least one processor circuit is configured to identify, at the previous time, the previous temperature of the second surface.

46. The system of claim 45 wherein the at least one processor circuit is configured to repeatedly identify and store successive values of the previous temperature of the second surface at successive respective times, to generate the temperature history of the workpiece.

47. The system of claim 45 wherein the at least one processor circuit is configured to identify the previous temperature of the second surface in response to a hemispherical reflectivity of the second surface.

48. The system of claim 47 further comprising a second measurement device in communication with the at least one processor circuit, wherein the at least one processor circuit is configured to cooperate with the second measurement device to measure the hemispherical reflectivity of the second surface.

49. The system of claim 48 wherein the second measurement device comprises a radiation detector configured to receive radiation reflected by the second surface, the detector being positioned sufficiently far away from the second surface to avoid obstructing the second surface from fields of view of other devices of the system.

50. The system of claim 48 wherein the second measurement device comprises a radiation detector configured to receive radiation reflected by the second surface, the detector being positioned a distance from a center of the second surface at least as great as one- half of the largest dimension of the workpiece.

51. The system of claim 48 wherein the at least one processor circuit is configured to identify the previous temperature of the second surface in response to the hemispherical reflectivity of the second surface and radiation thermally emitted by the second surface.

52. The system of claim 48 wherein the second measurement device comprises an imaging device.

53. The system of claim 52 wherein the imaging device comprises an lnGaAs photodiode array.

54. The system of claim 48 wherein the second measurement device comprises a detector configured to measure a directional reflectivity of the second surface.

55. The system of claim 54 wherein the at least one processor circuit is configured to apply a scattering correction to the directional reflectivity to obtain the hemispherical reflectivity.

56. The system of claim 55 wherein the at least one processor circuit is configured to generate the scattering correction.

57. The system of claim 54 wherein the second measurement device is configured to measure the directional reflectivity in an illumination wavelength band in which a heating irradiance spectrum incident upon the second surface has negligible intensity.

58. The system of claim 57 further comprising a filtering device configured to remove the illumination wavelength band from the heating irradiance spectrum.

59. The system of claim 58 wherein the filtering device comprises a water-cooled window interposed between the second surface and a source of the heating irradiance spectrum.

60. A temperature measurement system comprising:
  a) means for measuring a present intensity of radiation thermally emitted from a first surface of a workpiece, wherein the workpiece comprises a semiconductor wafer and the first surface comprises a device side of the wafer; and
  b) means for identifying a present temperature of the first surface, in response to the present intensity, a previous temperature of the first surface at a respective previous time and a previous intensity of radiation thermally emitted from the first surface at the previous time, wherein the means for identifying comprises means for identifying the present temperature of the device side while the device side is being exposed to an irradiance flash having a duration less than a thermal conduction time of the wafer.

61. The system of claim 60 further comprising means for identifying, at the previous time, the previous temperature of the first surface and the previous intensity of radiation thermally emitted from the first surface.

62. The system of claim 61 wherein the means for identifying the previous temperature comprises means for identifying the previous temperature of the first surface in response to a previous temperature of a second surface of the workpiece unequal to the previous temperature of the first surface.

63. The system of claim 62 wherein the means for identifying the previous temperature of the first surface comprises means for identifying the previous temperature of the first surface in response to the previous temperature of the second surface and a temperature history of the workpiece.

64. The system of claim 63 further comprising means for identifying, at the previous time, the previous temperature of the second surface.

65. The system of claim 64 wherein the means for identifying the previous temperature of the second surface comprises means for identifying the previous temperature of the second surface in response to a hemispherical reflectivity of the second surface.

66. The system of claim 65 further comprising means for measuring the hemispherical reflectivity.

67. A temperature measurement and heat-treating method comprising;
  a) measuring a present intensity of radiation thermally emitted from a first surface of a workpiece:
  b) identifying a present temperature of the first surface, in response to the present intensity, a previous temperature of the first surface at a respective previous time and a previous intensity of radiation thermally emitted from the first surface at the previous time; and
  c) controlling a power of an irradiance flash incident on the first surface of the workpiece, in response to the present temperature of the first surface.

68. The method of claim 67 wherein controlling comprises controlling power supplied to at least one irradiance source operable to produce the irradiance flash.

69. The method of claim 67 wherein controlling comprises activating one of a plurality of irradiance sources only if the present temperature of the first surface is less than a predefined threshold.

70. The method of claim 67 wherein the workpiece comprises a semiconductor wafer and the first surface comprises a device side of the wafer.

71. The method of claim 70 wherein identifying comprises identifying the present temperature of the device side while the device side is being exposed to an irradiance flash having a duration less than a thermal conduction time of the wafer.

72. A temperature measurement and heat-treating System comprising;
  a) a measurement device configured to measure a present intensity of radiation thermally emitted from a first surface of a workpiece:
  b) at least one processor circuit in communication with the measurement device, the at least one processor circuit configured to identify a present temperature of the first surface. in response to the present intensity, a previous temperature of the first surface at a respective previous time and a previous intensity of radiation thermally emitted from the first surface at the previous time: and
  c) an irradiance system operable to expose the first surface of the workpiece to an irradiance flash incident thereon, wherein the at least one processor circuit is configured to control a power of the irradiance flash in response to the present temperature of the first surface.

73. The system of claim 68 wherein the at least one processor circuit is configured to control power supplied to the irradiance system to control the power of the irradiance flash.

74. The system of claim 72 wherein the irradiance system comprises a plurality of irradiance sources, and wherein the at least one processor circuit is configured to activate one of the plurality of irradiance sources only if the present temperature of the first surface is less than a pre-defined threshold.

75. The system of claim 72 wherein the workpiece comprises a semiconductor wafer and the first surface comprises a device side of the wafer.

76. The system of claim 75 wherein the measurement device and the at least one processor circuit are configured to measure the present intensity and identify the present temperature of the device side while the device side is being exposed to an irradiance flash having a duration less than a thermal conduction time of the wafer.

77. A temperature measurement and heat-treating System comprising:
   a) means for measuring a present intensity of radiation thermally emitted from a first surface of a workpiece:
   b) means for identifying a present temperature of the first surface, in response to the present intensity, a previous temperature of the first surface at a respective previous time and a previous intensity of radiation thermally emitted from the first surface at the previous time: and
   c) means for controlling a power of an irradiance flash incident on the first surface of the workpiece, in response to the present temperature of the first surface.

78. The system of claim 77 wherein the workpiece comprises a semiconductor wafer and the first surface comprises a device side of the wafer, and wherein the means for identifying comprises means for identifying the present temperature of the device side while the device side is being exposed to an irradiance flash having a duration less than a thermal conduction time of the wafer.

* * * * *

UNITED STATES PATENT AND TRADEMARK OFFICE
CERTIFICATE OF CORRECTION

PATENT NO. : 7,445,382 B2  Page 1 of 1
APPLICATION NO. : 10/497447
DATED : November 4, 2008
INVENTOR(S) : Camm et al.

It is certified that error appears in the above-identified patent and that said Letters Patent is hereby corrected as shown below:

Column 7, Line 24, "is 1450nm." should be changed to --is 1450 nm.--

Column 9, Line 66, "of 1450 mn" should be changed to --of 1450 nm--

Column 14, Line 13, "that discloseu in" should be changed to --that disclosed in--

Column 17, Lines 66-67, "the 1450 mn" should be changed to --the 1450 nm--

Column 27, Line 8, "$T_{DEVICE}(t_o)$" should be changed to --$T_{DEVICE}(t_0)$--

Column 32, Line 48, "the second comprises" should be changed to --the second surface comprises--

Column 33, Line 25, "the Scattering correction." should be changed to --the scattering correction.--

Column 33, Line 32, "Illumination wavelength" should be changed to --illumination wavelength--

Column 36, Line 23, "comprising;" should be changed to --comprising:--

Column 36, Line 25, "of a workpiece:" should be changed to --of a workpiece;--

Column 36, Line 48, "comprising;" should be changed to --comprising:--

Column 36, Line 51, "of a workpiece:" should be changed to --of a workpiece;--

Column 36, Line 54, "surface. in" should be changed to --surface, in--

Column 36, Line 57, "previous time: and" should be changed to --previous time; and--

Column 37, Line 16, "of a workpiece:" should be changed to --of a workpiece;--

Column 38, Line 5, "previous time: and" should be changed to --previous time; and--

Signed and Sealed this

Twenty-ninth Day of June, 2010

David J. Kappos
*Director of the United States Patent and Trademark Office*